US012677409B2

(12) United States Patent
Kikuchi et al.

(10) Patent No.: US 12,677,409 B2
(45) Date of Patent: Jul. 7, 2026

(54) SEMICONDUCTOR DEVICE AND METHOD OF MANUFACTURING THE SAME

(71) Applicant: Kioxia Corporation, Tokyo (JP)

(72) Inventors: Tatsuki Kikuchi, Yokkaichi Mie (JP);
Keiko Sakuma, Yokkaichi Mie (JP);
Shosuke Fujii, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 707 days.

(21) Appl. No.: 17/984,535

(22) Filed: Nov. 10, 2022

(65) Prior Publication Data

US 2023/0422484 A1     Dec. 28, 2023

(30) Foreign Application Priority Data

Jun. 22, 2022     (JP) ................................. 2022-100420

(51) Int. Cl.
H10B 12/00          (2023.01)
H10D 30/67          (2025.01)

(52) U.S. Cl.
CPC ......... H10B 12/39 (2023.02); H10B 12/0387 (2023.02); H10D 30/6755 (2025.01)

(58) Field of Classification Search
CPC ....................... H10D 30/6755; H10D 30/6728
See application file for complete search history.

(56) References Cited

U.S. PATENT DOCUMENTS 9,698,272 B1 * 7/2017 Ikeda ................... H10D 86/481
11,139,396 B2 10/2021 Karda et al.

11,502,204 B2 * 11/2022 Gawase ............. H10D 30/6755
11,871,557 B2 * 1/2024 Shiokawa .............. H10B 12/30
2012/0261742 A1 * 10/2012 Hirano ................... H10D 30/69
                                                                257/324
2015/0076495 A1 * 3/2015 Miyairi ................. H10D 99/00
                                                                257/43
2018/0294362 A1 * 10/2018 Fukui ................... H10D 62/123
2019/0067437 A1 * 2/2019 Ramaswamy ..... H10D 30/6756
2019/0088795 A1 * 3/2019 Kanrei ................... H10B 43/27
2019/0237581 A1 8/2019 Saito et al.
2019/0295626 A1 * 9/2019 Ikeda ................... G11C 11/404
2020/0111916 A1 4/2020 Karda et al.
2020/0111919 A1 4/2020 Karda et al.
2021/0135010 A1 * 5/2021 Yamazaki ............. H10B 43/30
2022/0262438 A1 * 8/2022 Yamazaki ............. H10B 43/10
2023/0352090 A1 * 11/2023 Tsuda ................. H01L 23/5283
2023/0422484 A1 * 12/2023 Kikuchi ............. H10D 30/6728

FOREIGN PATENT DOCUMENTS

JP       2015-111663 A     6/2015
JP          6444135 B2    12/2018
JP       2019-134077 A     8/2019

* cited by examiner

*Primary Examiner* — Vincent Wall
(74) *Attorney, Agent, or Firm* — Maier & Maier, PLLC

(57)          ABSTRACT

According to one embodiment, a semiconductor device includes a first insulating layer, a gate electrode layer provided on the first insulating layer, a second insulating layer provided on the gate electrode layer, an oxide semiconductor layer provided along the second insulating layer, the gate electrode layer and the first insulating layer, a gate insulating layer provided along the second insulating layer, the gate electrode layer and the first insulating layer, and surrounding a side surface of the oxide semiconductor layer, and a first hydrogen barrier film surrounding the oxide semiconductor layer and the gate insulating layer.

17 Claims, 23 Drawing Sheets

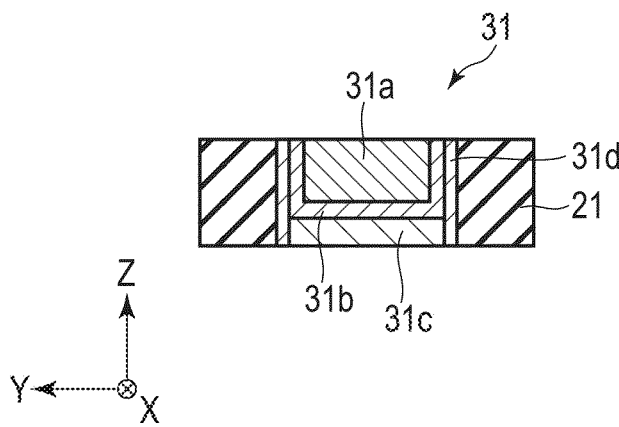
F I G. 3
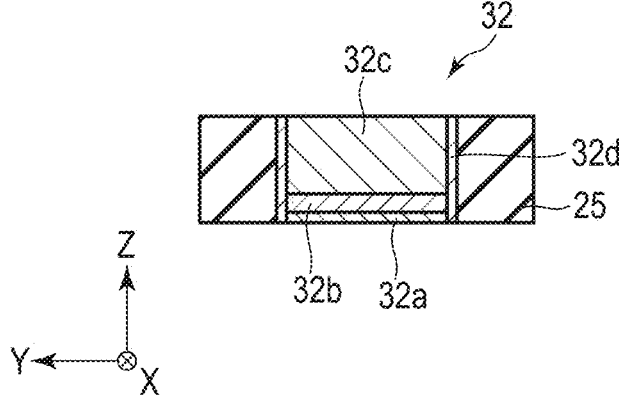
F I G. 4

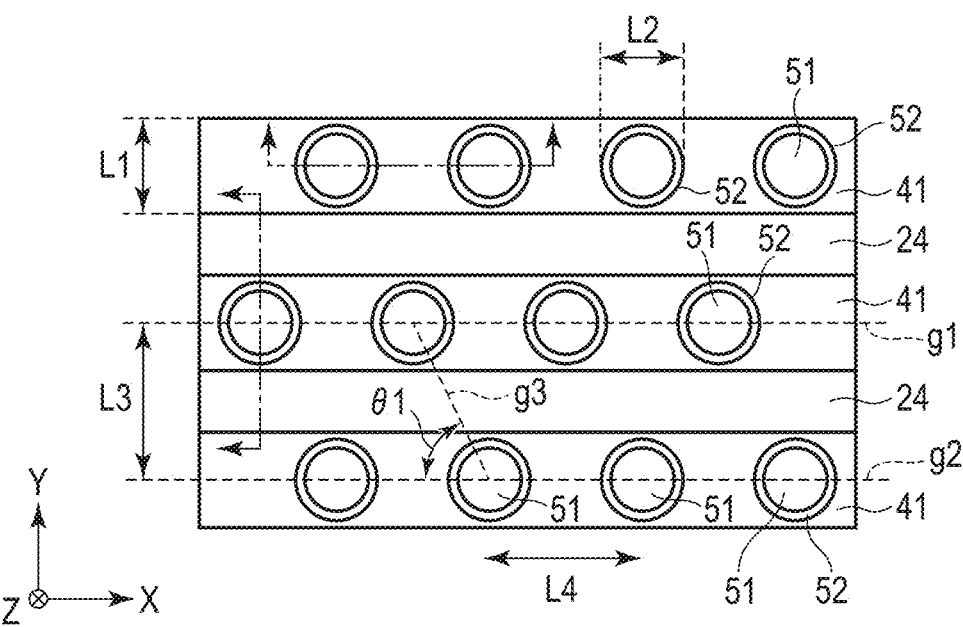
F I G. 5
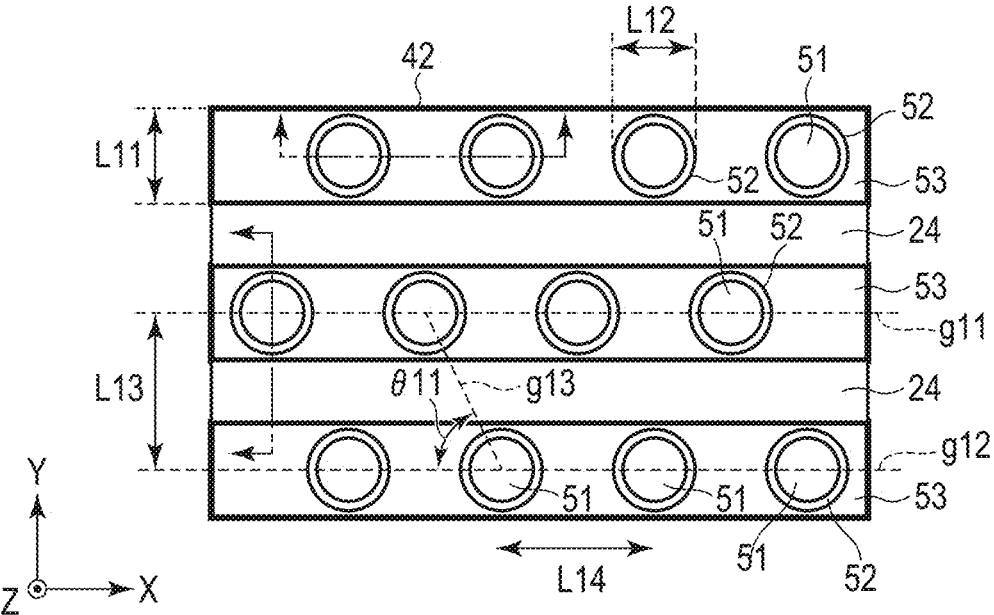
F I G. 6

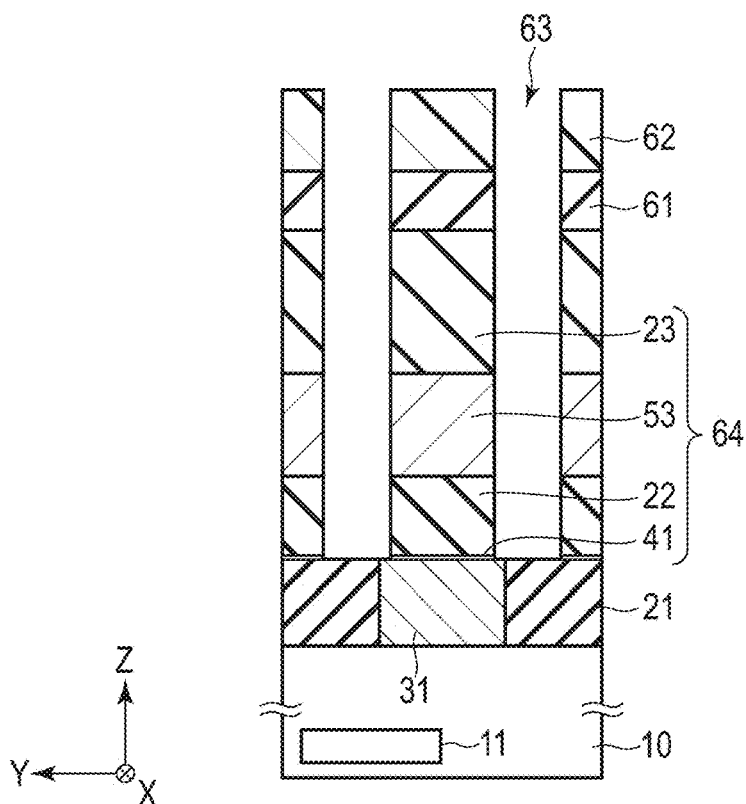
F I G. 9A
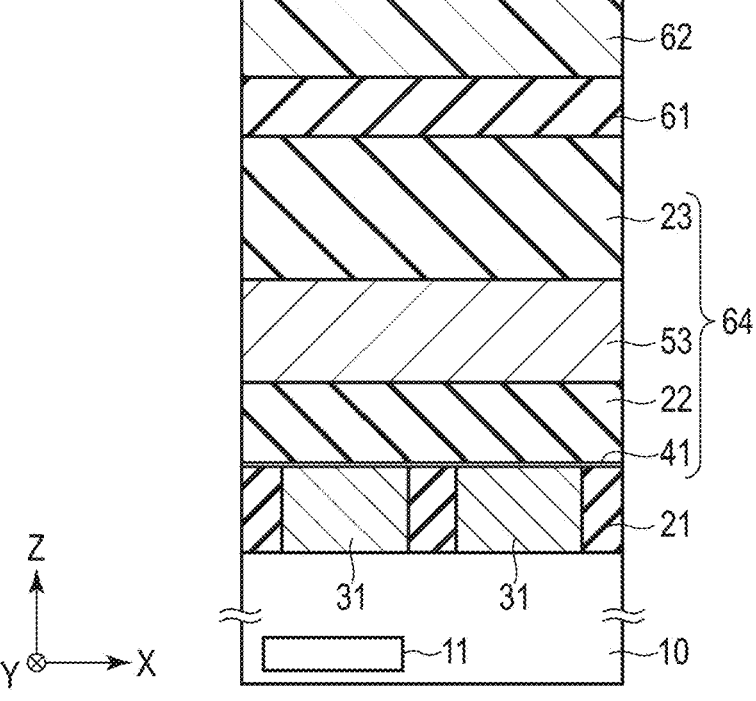
F I G. 9B

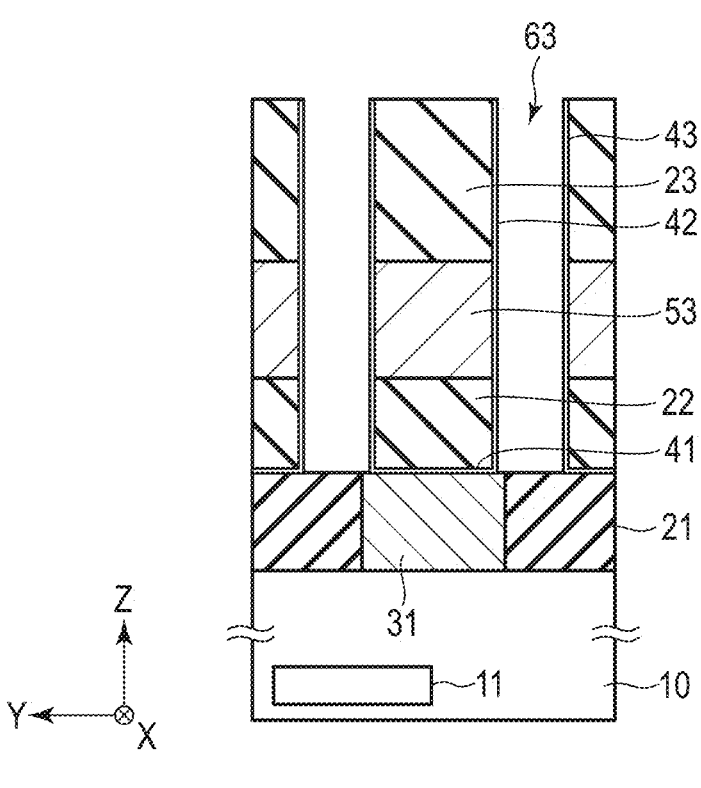
F I G. 10A
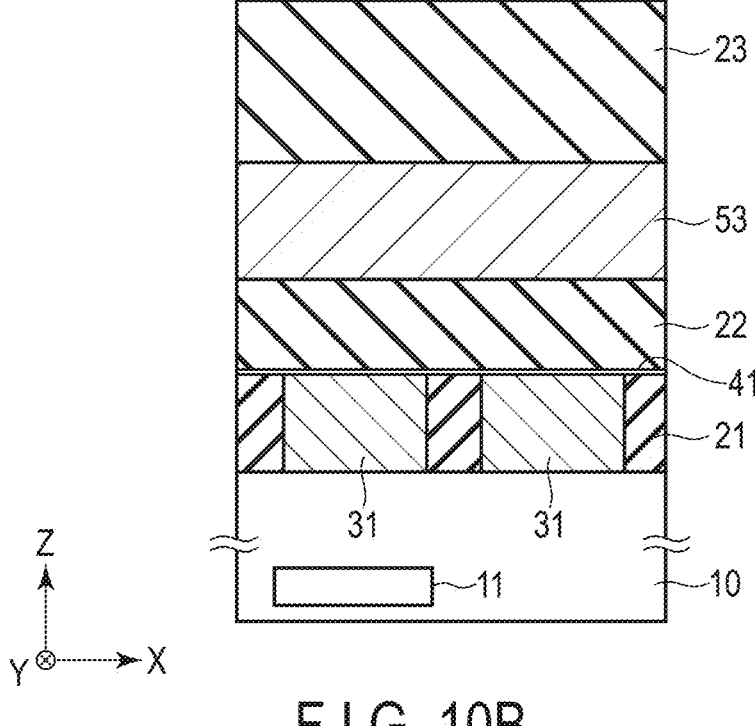
F I G. 10B

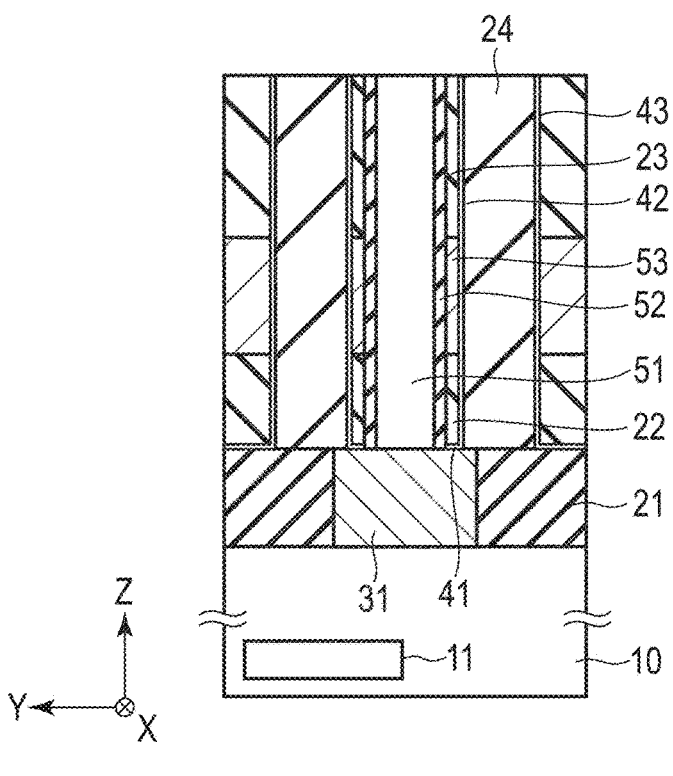
F I G. 13A
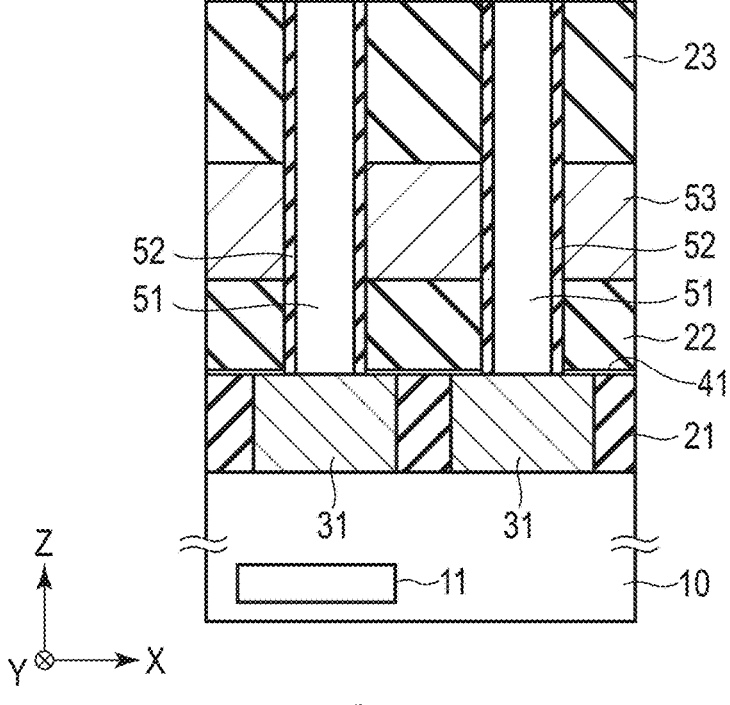
F I G. 13B

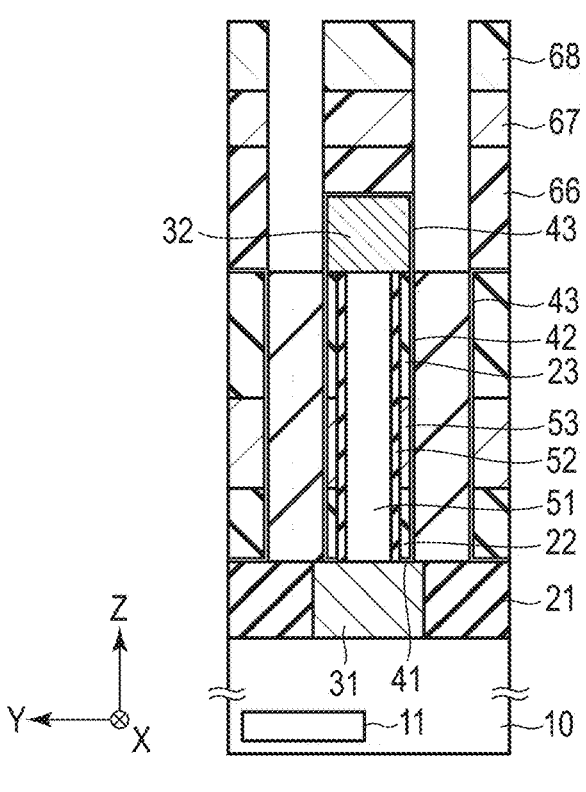
F I G. 16A
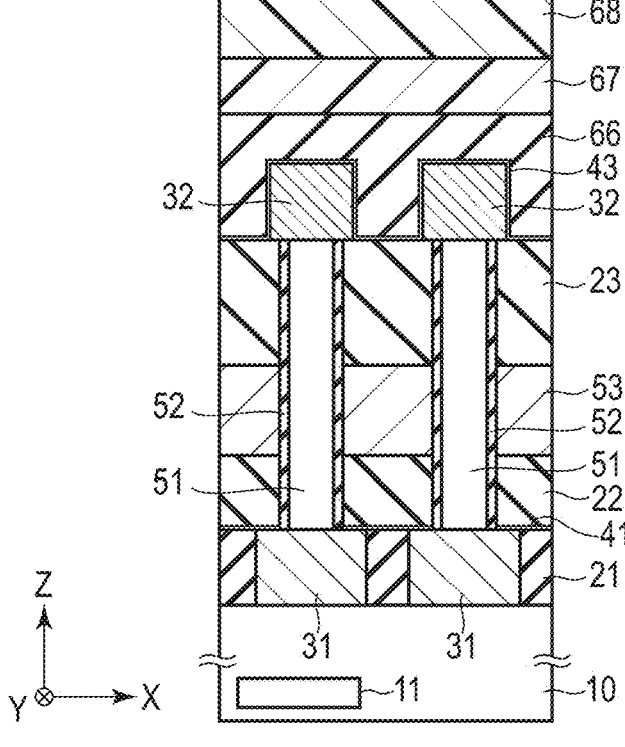
F I G. 16B

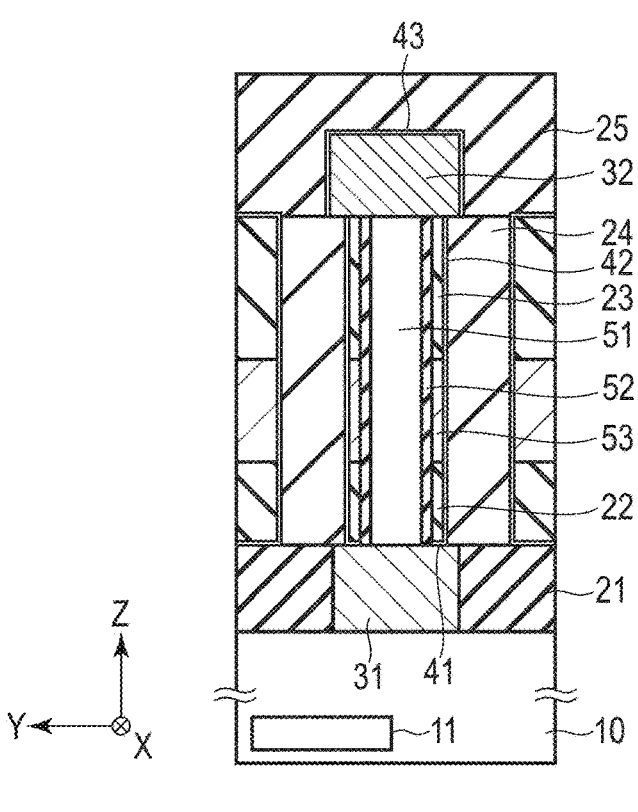
F I G. 17A
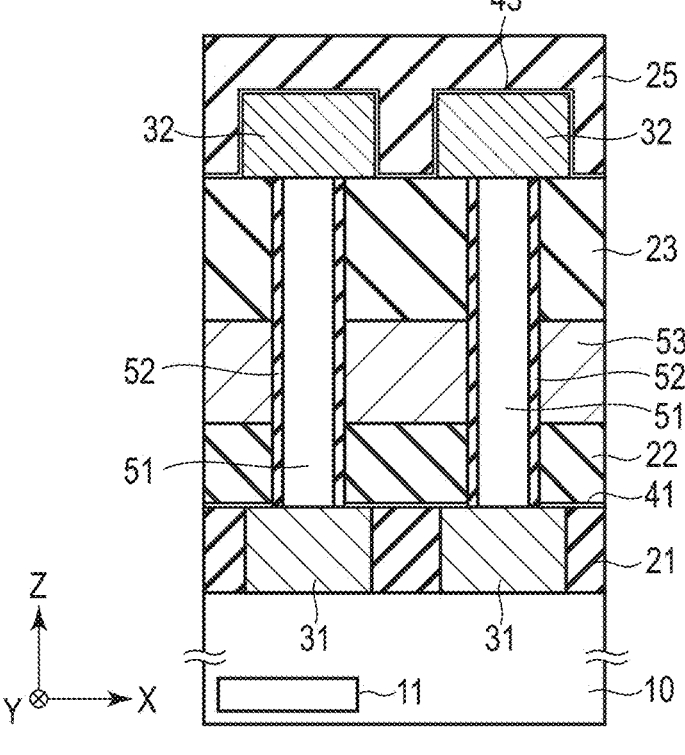
F I G. 17B

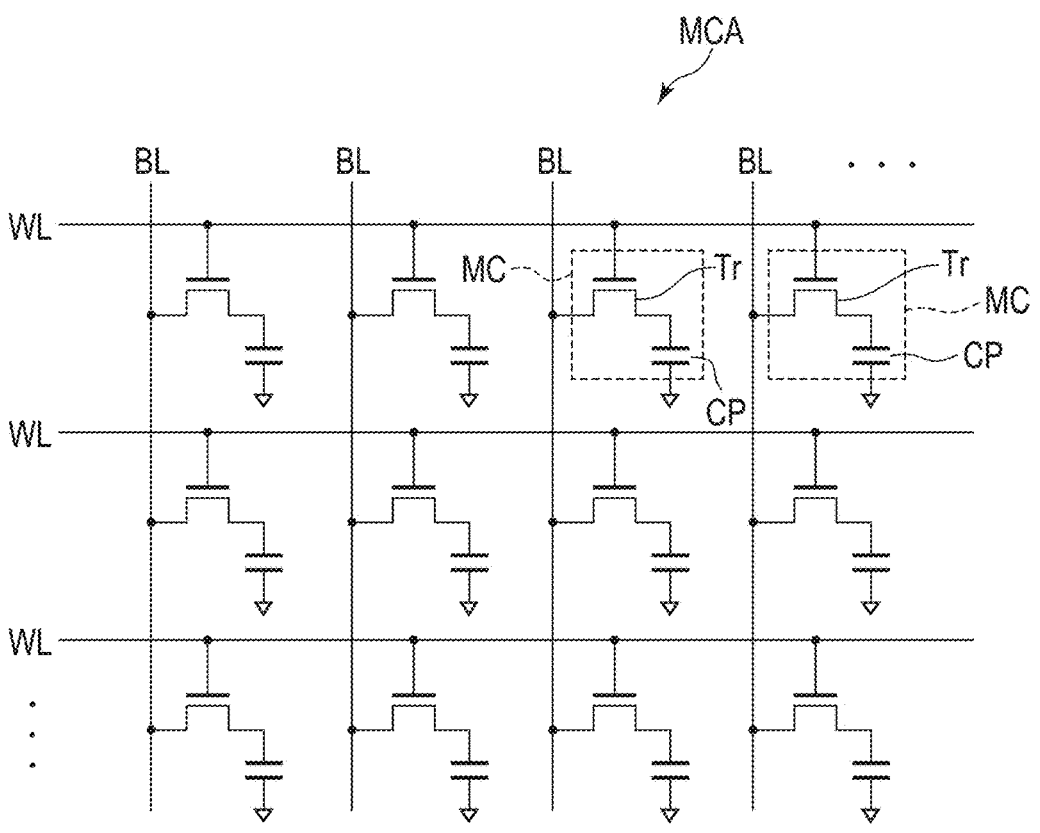
F I G. 20
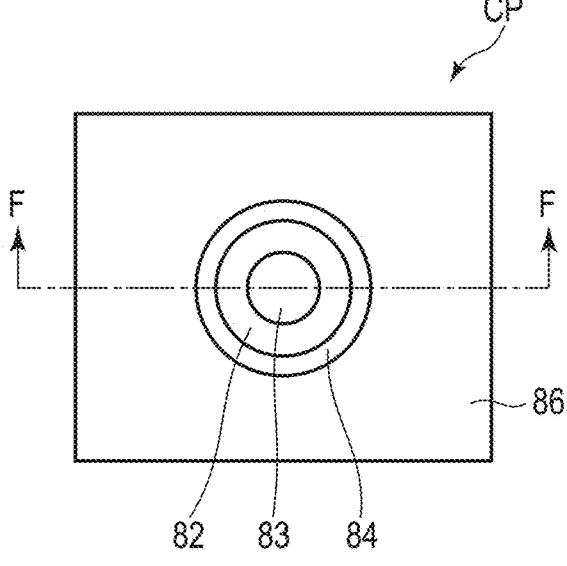
F I G. 21

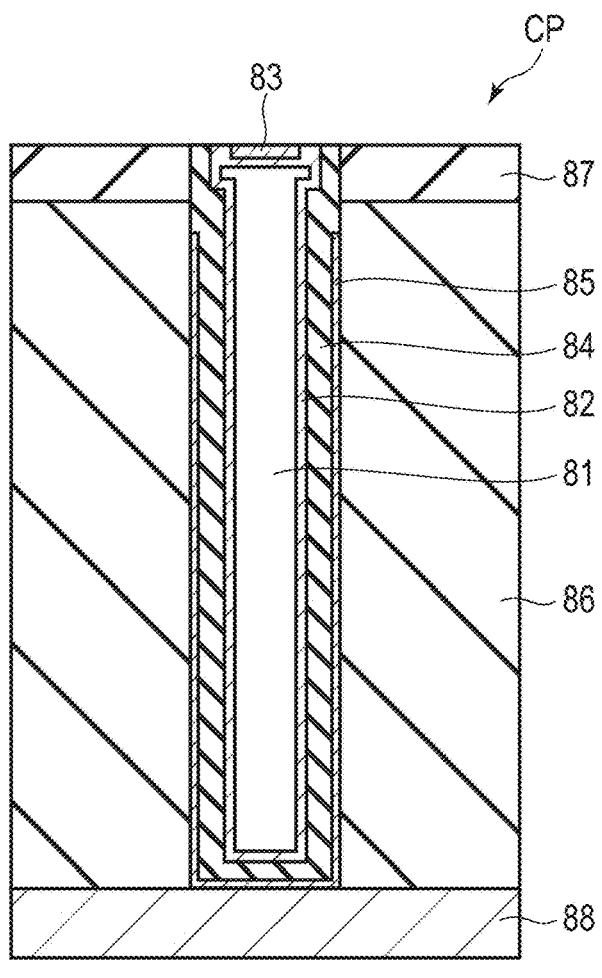
F I G. 22
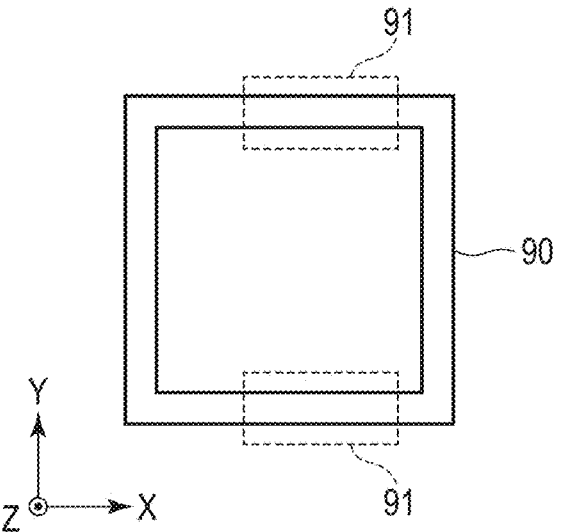
F I G. 23

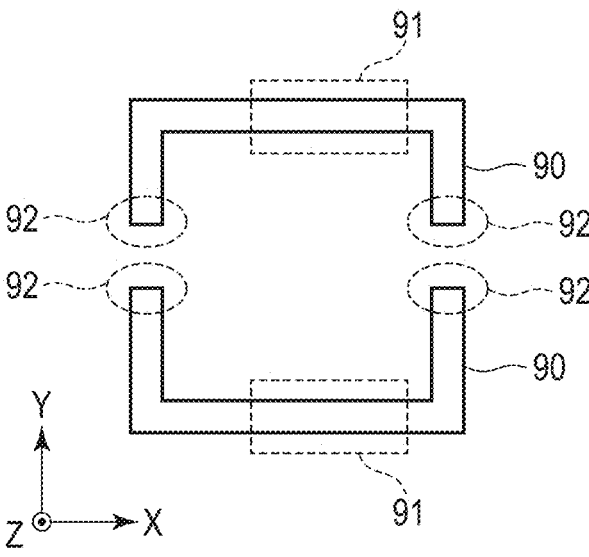
F I G. 24
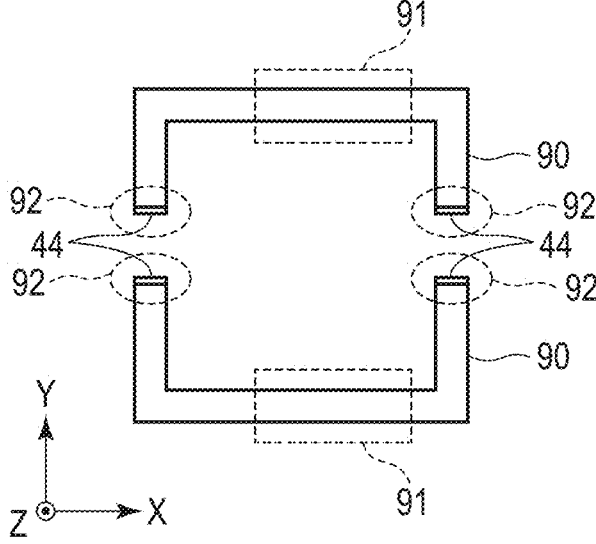
F I G. 25

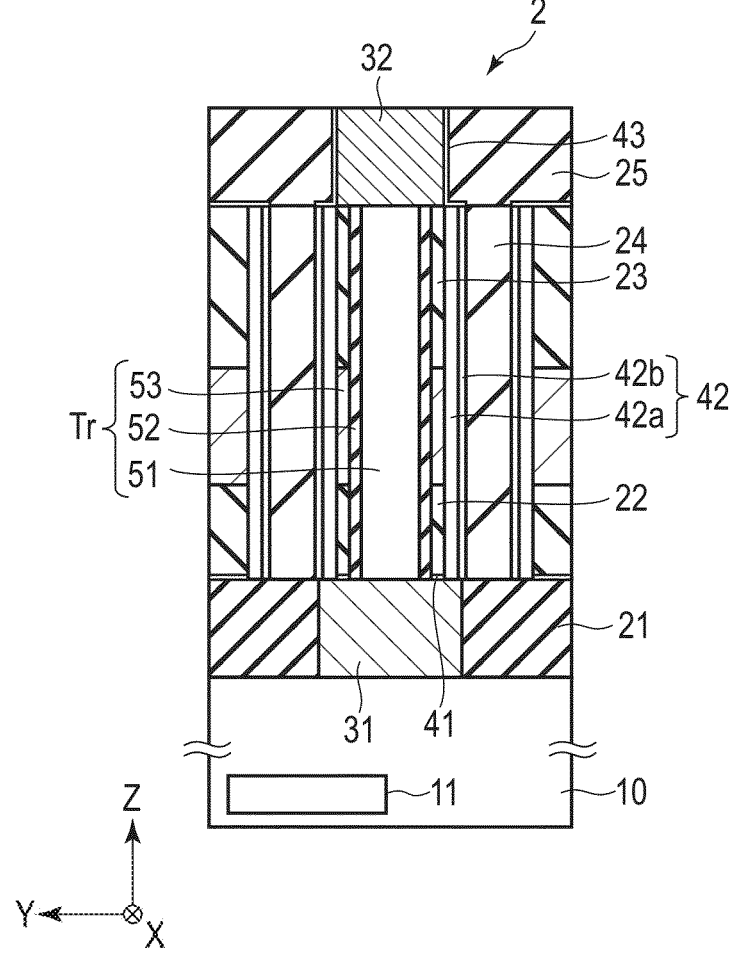
F I G. 26

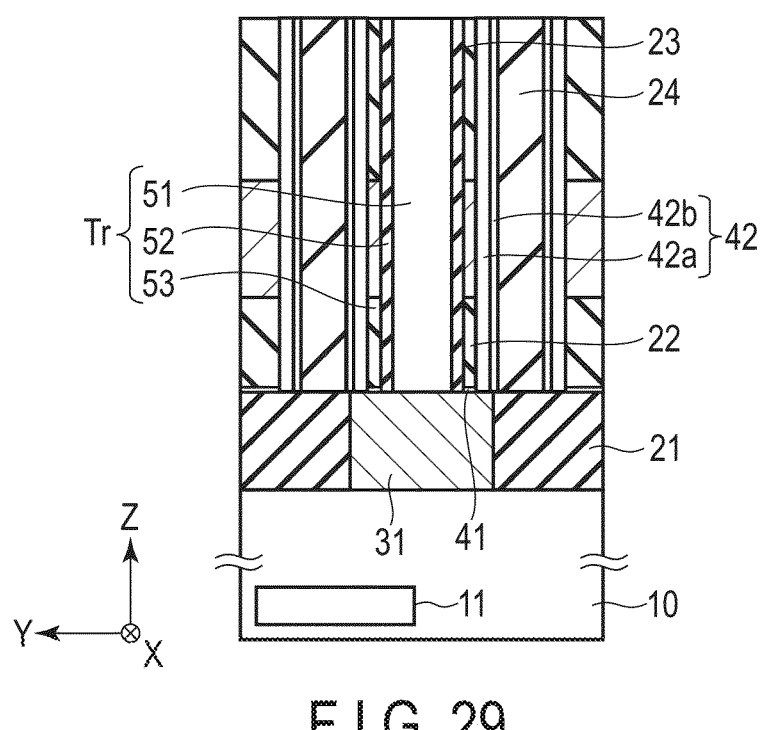
F I G. 29
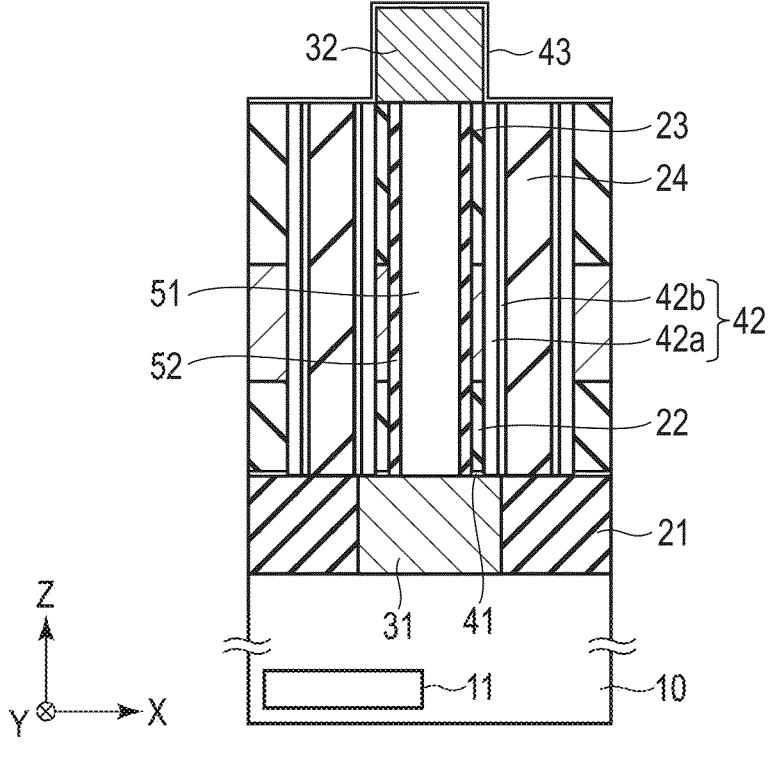
F I G. 30

SEMICONDUCTOR DEVICE AND METHOD OF MANUFACTURING THE SAME

CROSS-REFERENCE TO RELATED APPLICATIONS

This application is based upon and claims the benefit of priority from Japanese Patent Application No. 2022-100420, filed Jun. 22, 2022, the entire contents of which are incorporated herein by reference.

FIELD

Embodiments described herein relate generally to a semiconductor device including an oxide semiconductor layer and a method of manufacturing the same.

BACKGROUND

A semiconductor device using a transistor including an oxide semiconductor layer is known as one of the semiconductor devices. In this transistor, a channel is formed in an oxide semiconductor layer.

BRIEF DESCRIPTION OF THE DRAWINGS

FIG. 3 is a cross-sectional view showing an example of a structure of a bottom electrode of the semiconductor device according to the first embodiment.

FIG. 4 is a cross-sectional view showing an example of a structure of a top electrode of the semiconductor device according to the first embodiment.

FIG. 5 is a plan view showing a layout of an insulating layer, a hydrogen barrier film, a gate insulating layer, and an oxide semiconductor layer of the semiconductor device according to the first embodiment.

FIG. 6 is a plan view showing a layout of an insulating layer, a hydrogen barrier film, a gate electrode layer, an oxide semiconductor layer, and a gate insulating layer of the semiconductor device according to the first embodiment.

FIG. 9A is a cross-sectional view showing a manufacturing process of the semiconductor device according to the first embodiment.

FIG. 9B is a cross-sectional view showing a manufacturing process of the semiconductor device according to the first embodiment.

FIG. 10A is a cross-sectional view showing a manufacturing process of the semiconductor device according to the first embodiment.

FIG. 10B is a cross-sectional view showing a manufacturing process of the semiconductor device according to the first embodiment.

FIG. 13A is a cross-sectional view showing a manufacturing process of the semiconductor device according to the first embodiment.

FIG. 13B is a cross-sectional view showing a manufacturing process of the semiconductor device according to the first embodiment.

FIG. 16A is a cross-sectional view showing a manufacturing process of the semiconductor device according to the first embodiment.

FIG. 16B is a cross-sectional view showing a manufacturing process of the semiconductor device according to the first embodiment.

FIG. 17A is a cross-sectional view showing a manufacturing process of the semiconductor device according to the first embodiment.

FIG. 17B is a cross-sectional view showing a manufacturing process of the semiconductor device according to the first embodiment.

FIG. 20 is an equivalent circuit, illustrating a part of a memory cell array part of a DRAM.

FIG. 21 is a top view showing an example of a capacitor of a memory cell.

FIG. 22 is a cross-sectional view taken along line F-F of FIG. 21.

FIG. 23 is a plan view showing a line with a closed-loop pattern.

FIG. 24 is a plan view showing a loop-cut line.

FIG. 25 is a plan view showing a loop-cut line and a hydrogen barrier film provided thereon.

FIG. 26 is a cross-sectional view showing a schematic structure of a semiconductor device according to a second embodiment.

FIG. 29 is a cross-sectional view showing a manufacturing process of the semiconductor device according to the second embodiment.

FIG. 30 is a cross-sectional view showing a manufacturing process of the semiconductor device according to the second embodiment.

DETAILED DESCRIPTION

Figure 1:
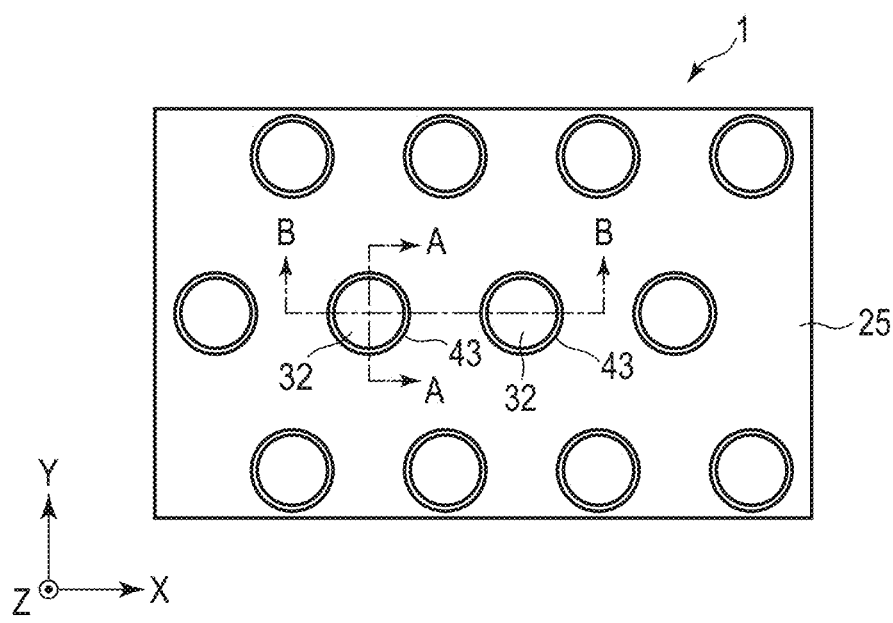
FIG. 1 is a top view showing a schematic structure of a semiconductor device according to a first embodiment.

In general, according to one embodiment, a semiconductor device includes: a first insulating layer; a gate electrode layer provided on the first insulating layer; a second insulating layer provided on the gate electrode layer; an oxide semiconductor layer provided along the second insulating layer, the gate electrode layer and the first insulating layer; a gate insulating layer provided along the second insulating layer, the gate electrode layer and the first insulating layer, and surrounding a side surface of the oxide semiconductor layer; and a first hydrogen barrier film surrounding the oxide semiconductor layer and the gate insulating layer, wherein the first insulating layer, the gate electrode layer and the second insulating layer are interposed between the first hydrogen barrier film and a layer including the oxide semiconductor layer and the gate insulating layer.

Embodiments will be described hereinafter with reference to the accompanying drawings. The drawings are schematic or conceptual drawings, and dimensions and ratios are not necessarily the same as those in reality. Further, in the drawings, the same reference symbols (including those having different subscripts) denote the same or corresponding parts, and overlapping explanations thereof will be made as necessary. In addition, as used in the description and the appended claims, what is expressed by a singular form shall include the meaning of "more than one".

First Embodiment

Figure 2A:
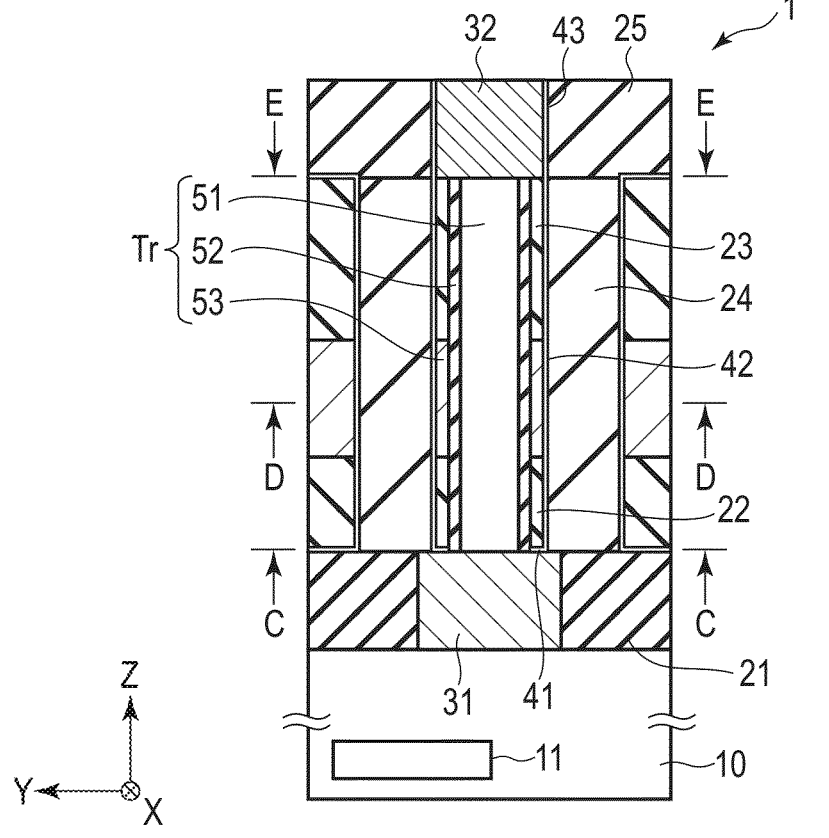
FIG. 2A is a cross-sectional view taken along line A-A in FIG. 1.
Figure 2B:
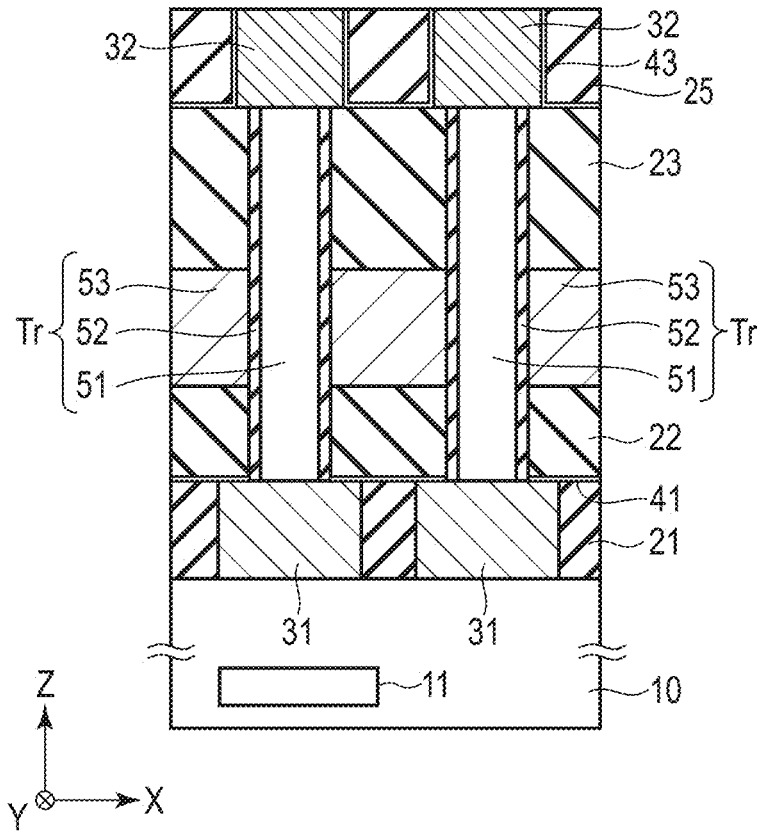
FIG. 2B is a cross-sectional view taken along line B-B in FIG. 1.

FIG. 1 is a top view showing a semiconductor device 1 according to a first embodiment. FIG. 2A is a cross-sectional view taken along line A-A in FIG. 1. FIG. 2B is a cross-sectional view taken along line B-B in FIG. 1. FIG. 1, FIG. 2A and FIG. 2B show X, Y and Z axes that are orthogonal to each other. A cross section of FIG. 2A is parallel to a Y-Z plane defined by the Y and Z axes. A cross section of FIG. 2B is parallel to an X-Z plane defined by the X and Z axes.

The semiconductor device 1 includes a substrate 10, insulating layers 21 to 25, a bottom electrode 31, a top electrode 32, hydrogen barrier films 41 to 43, an oxide semiconductor layer 51, a gate insulating layer 52, and a gate electrode layer 53.

The substrate 10 includes a semiconductor substrate such as a silicon substrate. A circuit 11 is provided in a semiconductor substrate. The circuit 11 is, for example, a complementary metal-oxide semiconductor (CMOS) circuit.

The insulating layer 21 is provided on the substrate 10. The insulating layer 21 is, for example, a silicon oxide layer containing $SiO_2$ or a silicon nitride layer containing $Si_3N_4$.

The bottom electrode 31 is provided in the insulating layer 21. The bottom electrode 31 has, for example, a columnar structure. FIG. 3 is a cross-sectional view showing an example of a structure of the bottom electrode 31. The bottom electrode 31 includes an electrode 31a, a barrier metal film 31b, an electrode 31c, and a barrier metal film 31d. The barrier metal film 31b is provided on a bottom surface and a side surface of the electrode 31a. The barrier metal film 31d is provided on a side surface of the electrode 31c and a side surface of the barrier metal film 31b. The electrode 31a contains indium tin oxide (ITO). The barrier metal films 31b and 31d contain titanium nitride. Titanium nitride in the barrier metal films 31b and 31d has a property of inhibiting hydrogen permeation.

The insulating layer (first insulating layer) 22, the gate electrode layer 53, and the insulating layer (second insulating layer) 23 are sequentially provided on the insulating layer 21. The insulating layers 22 and 23 are, for example, silicon oxide layers containing $SiO_2$ or silicon nitride layers containing $Si_3N_4$. The gate electrode layer 53 contains, for example, tungsten (W).

The oxide semiconductor layer 51 penetrates the insulating layer 22, the gate electrode layer 53, and the insulating layer 23. As a result, the semiconductor device 1 includes a structure in which the oxide semiconductor layer 51 is provided along the insulating layer 23, the gate electrode layer 53, and the insulating layer 22. The shape of the oxide semiconductor layer 51 is columnar, extending in the Z-axis direction. A lower surface of the oxide semiconductor layer 51 is connected to an upper surface of the bottom electrode 31. The oxide semiconductor layer 51 contains, for example, indium, gallium, zinc, and oxygen. A material containing indium, gallium, zinc, and oxygen is called indium gallium zinc oxide (IGZO).

The gate insulating layer 52 penetrates the insulating layer 22, the gate electrode layer 53, and the insulating layer 23 so as to surround a side surface of the oxide semiconductor layer 51. As a result, the semiconductor device 1 includes a structure in which the gate insulating layer 52 is provided along the insulating layer 23, the gate electrode layer 53, and the insulating layer 22. The shape of the gate insulating layer 52 is a cylindrical shape extending in the Z-axis direction. A lower part of the side surface of the gate insulating layer 52 is surrounded by the insulating layer 22. An upper part of the side surface of the gate insulating layer 52 is surrounded by the insulating layer 23. A portion (center portion) between the lower and upper portions of the side surface of the gate insulating layer 52 is surrounded by the gate electrode layer 53. A lower surface of the gate insulating layer 52 is connected to the upper surface of the bottom electrode 31. The gate insulating layer 52 contains, for example, silicon oxide such as $SiO_2$.

The oxide semiconductor layer 51, the gate insulating layer 52, and the gate electrode layer 53 constitute a vertical transistor Tr. A channel of the vertical transistor Tr is formed in the oxide semiconductor layer 51. A direction of the channel is a direction (Z-axis direction) perpendicular to the upper surface of the substrate 10. The direction of the channel may be shifted from the Z-axis direction to some extent. The vertical transistor Tr is also referred to as surrounding gate transistor (SGT).

The vertical transistor Tr using the oxide semiconductor layer 51 is a junctionless transistor that does not require a pn junction. In the junctionless transistor, the conductivity types of the source region, the drain region, and the channel region are the same. The oxide semiconductor 51 contains n-type dopant or p-type dopant.

The hydrogen barrier film 41 is provided between the upper surface of the bottom electrode 31 and a lower surface of the insulating layer 22. The hydrogen barrier film 41 plays a role of suppressing hydrogen permeation. For this reason, the hydrogen barrier film 41 suppresses hydrogen diffusing from an interface between the upper surface of the bottom electrode 31 and the lower surface of the insulating layer 22 into the oxide semiconductor layer 51. The hydrogen barrier film 41 is, for example, an insulating film with lower hydrogen permeability than a silicon dioxide film. More specifically, the hydrogen barrier film 41 is a silicon nitride film, an alumina film, a titanium oxide film, or a chromium oxide film.

The hydrogen barrier film (first hydrogen barrier film) 42 surrounds the oxide semiconductor layer 51 and the gate insulating layer 52 such that the insulating layer 22, the gate electrode layer 53 and the insulating layer 23 are interposed between the hydrogen barrier film 42 and a layer including the oxide semiconductor layer 51 and the gate insulating layer 52. The side surface of the insulating layer 22, the side surface of the gate electrode layer 53, and the side surface of the insulating layer 23 are covered with a hydrogen barrier film 42. The hydrogen barrier film 42 plays a role of suppressing permeation of hydrogen. For this reason, the hydrogen barrier film 42 suppresses hydrogen diffusing from the side surface of the insulating layer 22, the side surface of the gate electrode layer 53, and the side surface of the insulating layer 23 into the oxide semiconductor layer 51. The hydrogen barrier film 42 is, for example, an insulating film with lower hydrogen permeability than a silicon dioxide film, more specifically, a silicon nitride film, an alumina film, a titanium oxide film, or a chromium oxide film.

The insulating layer (third insulating layer) 24 is provided on the side surface of the insulating layer 22, the side surface of the gate electrode layer 53 and the side surface of the insulating layer 23 such that the hydrogen barrier film 42 is interposed between the insulating layer 24 and a layer including the insulating layer 22, the gate electrode layer 53 and the insulating layer 23. The lower surface of the insulating layer 24 is not covered with a hydrogen barrier films such as hydrogen barrier film 41 or 42. The lower surface of the insulating layer 24 is in contact with a part of the upper surface of the insulating layer 21 and a part of the upper surface of the bottom electrode 31. The lower surface of the insulating layer 24 may be at the same position as the upper surface of the bottom electrode 31 or a position lower than the upper surface of the bottom electrode 31. The upper surface of the insulating layer 24 is not covered with a hydrogen barrier film such as the hydrogen barrier film 41 or 42. The upper surface of the insulating layer 24 is in contact with the lower surface of the insulating layer 25 to be described below. The insulating layer 24 is, for example, a silicon oxide layer containing $SiO_2$ or a silicon nitride layer containing $Si_3N_4$.

The top electrode 32 is provided on the upper surface of the oxide semiconductor layer 51. In this example, the top electrode 32 is provided on the upper surface of the gate insulating layer 52 and the upper surface of the insulating layer 23.

FIG. 4 is a cross-sectional view showing an example of the structure of the top electrode 32. The top electrode 32 includes an electrode 32a, a barrier metal film 32b, an electrode 32c, and a barrier metal film 32d. The barrier metal film 32b is provided between the electrodes 32a and 32c. The barrier metal film 32d is provided on the side surface of the electrode 32a, the side surface of the barrier metal film 32b, and the side surface of the electrode 32c. The electrode

32a contains ITO. The barrier metal films 32b and 32d contain titanium nitride. Titanium nitride in the barrier metal films 32b and 32d has a property of suppressing hydrogen permeation.

The hydrogen barrier film (second hydrogen barrier film) 43 surrounds the side surface of the top electrode 32. The insulating layer 25 surrounds the side wall of the top electrode 32 such that the hydrogen barrier film 43 is interposed between the insulating layer 25 and the top electrode 32. The hydrogen barrier film 43 plays a role of suppressing hydrogen permeation. For this reason, the hydrogen barrier film 43 suppresses diffusion of hydrogen that permeates the insulating layer 25 from the side surface of the top electrode 32 into the oxide semiconductor layer 51. The hydrogen barrier film 43 is, for example, an insulating film with lower hydrogen permeability than a silicon dioxide film, more specifically, a silicon nitride film, an alumina film, a titanium oxide film, or a chromium oxide film. The insulating layer 25 is, for example, a silicon oxide layer or a silicon nitride layer.

In this example, the upper surface of the top electrode 32 is not covered with the hydrogen barrier film 43. However, the barrier metal film 32b (FIG. 4) in the top electrode 32 contains titanium nitride, which has a property of suppressing hydrogen permeation. For this reason, hydrogen diffusion from the upper surface of the top electrode 32 into the hydrogen barrier film 43 is suppressed by the barrier metal film 31b.

According to this example, since hydrogen diffusion into the oxide semiconductor layer 51 is suppressed by the hydrogen barrier films 41, 42, and 43, the characteristic degradation of the oxide semiconductor layer 51 caused by hydrogen is suppressed. The semiconductor device 1 including the vertical transistor Tr that can attempt to suppress the characteristic degradation can be therefore obtained. One of reasons for hydrogen diffusion into the oxide semiconductor layer 51 is annealing in an atmosphere containing hydrogen, which is performed during the manufacturing process of the semiconductor device 1. The annealing will be described again when explaining a method of manufacturing the semiconductor device 1.

One of examples of the characteristic degradation caused by hydrogen in the oxide semiconductor layer 51 is a shift in the threshold voltage of the vertical transistor Tr. When the threshold voltage shifts, for example, when the gate voltage is applied to the gate electrode layer 53, the depletion layer formed in the channel region of the oxide semiconductor layer 51 becomes smaller. The vertical transistor Tr is turned off by formation of a depletion layer in the channel region. For this reason, when the depletion layer becomes smaller, the off characteristic of the vertical transistor Tr is deteriorated. In this example, however, since the characteristic degradation caused by hydrogen in the oxide semiconductor layer 51 can be suppressed, the characteristic degradation of the vertical transistor Tr such as a shift in the threshold voltage can be suppressed.

It is not necessary to use all of the hydrogen barrier films 41, 42 and 43.

In addition, the hydrogen barrier film 41, the hydrogen barrier film 42, and the hydrogen barrier film 43 also play a role of confining oxygen in the oxide semiconductor layer 51. The characteristic degradation of the oxide semiconductor layer 51 caused by decrease in the oxygen concentration in the oxide semiconductor layer 51 can be thereby suppressed.

The semiconductor device 1 in this example includes a plurality of vertical transistors Tr. Since four top electrodes 32 are shown in the first row of FIG. 1, the number of vertical transistors Tr in the first row is four. Similarly, the number of vertical transistors Tr in the second row is four and the number of vertical transistors Tr in the third row is four. The total number of vertical transistors Tr is twelve. However, the number of rows is not limited to three, and the number of vertical transistors TR per row is not limited to four either. When the first, second and third rows do not need to be distinguished, each of them is referred to as an i-th row in the following descriptions.

FIG. 5 is a plan view showing a layout of the hydrogen barrier film 41, the insulating layer 24, the gate insulating layer 52, and the oxide semiconductor layer 51.

The cross-sectional view along a one-dot chain line in FIG. 5 corresponds to the cross-sectional view of the insulating layer 24, the hydrogen barrier film 41, the gate insulating layer 52, and the oxide semiconductor layer 51 in FIG. 2A. In addition, the cross-sectional view along a two-dot chain line in FIG. 5 corresponds to the cross-sectional view of the hydrogen barrier film 41, the gate insulating layer 52, and the oxide semiconductor layer 51 in FIG. 2B.

In other words, FIG. 5 corresponds to the plan view of the hydrogen barrier film 41, the insulating layer 24, the gate insulating layer 52, and the oxide semiconductor layer 51 as shown in FIG. 2A, which are sectioned in the X-Y plane and viewed from an arrow direction C-C.

A layout in which the area of the memory cell is $4F^2$ (where F refers to the feature size) is shown in FIG. 5, but the area of the memory cell is not limited to $4F^2$.

In FIG. 5, a dimension L1 in the Y-axis direction of a portion of the hydrogen barrier film 41 in which the oxide semiconductor layer 51 and the gate insulating layer 52 are not provided is, for example, in a range from approximately 32 to 36 nm. In addition, an outer dimension L2 of the gate insulating layer 52 is, for example, approximately 24.2 nm. In addition, a dimension L3 in the Y-axis direction between a broken line g1 passing through the centers of the four oxide semiconductor layers 51 in the i-th row and a broken line g2 passing through the centers of the four oxide semiconductor layers 51 in the (i+1)-th row is, for example, approximately 54 nm. In addition, a distance L4 between the centers of the two adjacent oxide semiconductor layers 51 in the i-th row is approximately 63 nm. In addition, an angle θ1 formed between the broken line g2 and a broken line g3 linking the center of the j-th (i=1, 2, 3, and 4) oxide semiconductor layer 51 from the left in the i-th row to the center of the j-th oxide semiconductor layer 51 from the left in the (i+1)-th row is approximately 59.7 degrees.

In addition, as shown in FIG. 5, four oxide semiconductor layers 51 and four gate insulating layers 52 of the four vertical transistors in the i-th row are surrounded by the single hydrogen barrier film 41. In other words, in the semiconductor device of the embodiment, a structure in which four oxide semiconductor layers 51 and four gate insulating layers 52 in the i-th row are surrounded by separate hydrogen barrier films 41 is not employed.

FIG. 6 is a plan view showing a layout of the insulating layer 24, the hydrogen barrier film 42, the gate electrode layer 53, the gate insulating layer 52, and the oxide semiconductor layer 51.

The cross-sectional view along a one-dot chain line in FIG. 6 corresponds to the cross-sectional view of the insulating layer 24, the hydrogen barrier film 42, the gate electrode layer 53, the gate insulating layer 52, and the oxide semiconductor layer 51 in FIG. 2A. In addition, the cross-sectional view along a two-dot chain line in FIG. 5 corresponds to the cross-sectional view of the gate electrode layer 53, the gate insulating layer 52, and the oxide semiconductor layer 51 in FIG. 2B.

In other words, FIG. 6 corresponds to the plan view of the insulating layer 24, the hydrogen barrier film 42, the gate electrode layer 53, the gate insulating layer 52, and the oxide semiconductor layer 51 as shown in FIG. 2A, which are sectioned in the X-Y plane and viewed from an arrow direction D-D.

In FIG. 6, a dimension L11 in the Y-axis direction of a portion of the gate electrode layer 53 in which the oxide semiconductor layer 51 and the gate insulating layer 52 are not provided is, for example, in a range from approximately 32 to 36 nm. In addition, an outer dimension L12 of the gate insulating layer 52 is, for example, approximately 29.4 nm. Since the outer dimension L12 of the gate insulating layer 52 is larger than the outer dimension L2 (approximately 24.2 nm) of the gate insulating layer 52, the vertical transistor has a columnar structure that is tapered from the top electrode to the bottom electrode. In addition, a dimension L13 in the Y-axis direction between a broken line g11 passing through the centers of the four oxide semiconductor layers 51 in the i-th row and a broken line g12 passing through the centers of the four oxide semiconductor layers 51 in the (i+1)-th row is, for example, approximately 54 nm. In addition, a distance L14 between the centers of the two adjacent oxide semiconductor layers 51 in the i-th row is approximately 63 nm. In addition, an angle θ11 formed between the broken line g12 and a broken line g13 linking the center of the j-th (i=1, 2, 3, and 4) oxide semiconductor layer 51 from the left in the i-th row to the center of the j-th oxide semiconductor layer 51 from the left in the (i+1)-th row is approximately 59.7 degrees.

In addition, since four oxide semiconductor layers 51 and four gate insulating layers 52 in the i-th row penetrate one gate electrode layer 53, four vertical transistors the i-th row share one gate electrode layer 53 as shown in FIG. 6. This gate electrode layer 53 is surrounded by one hydrogen barrier film 42.

Figure 7:
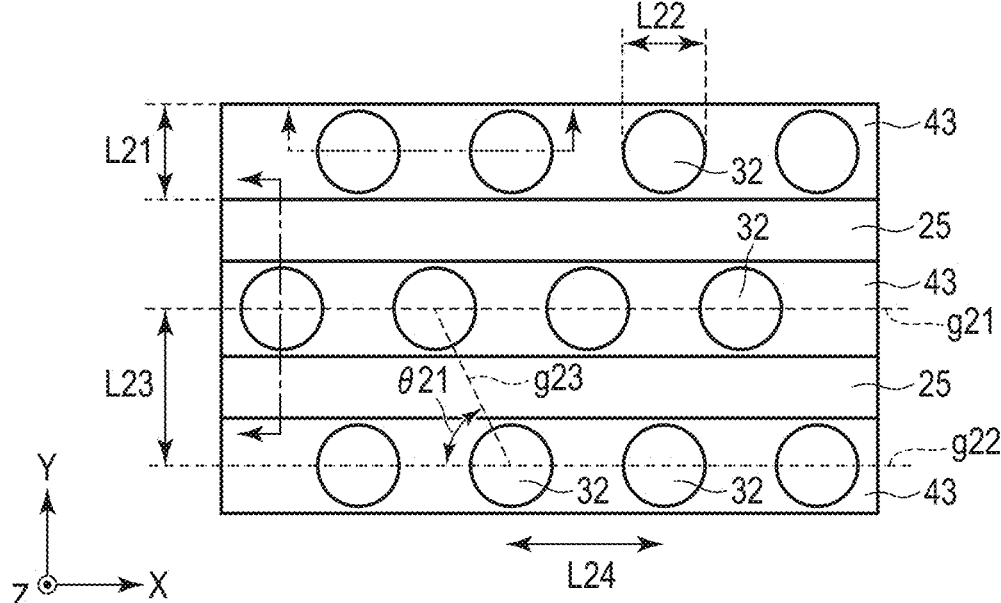
FIG. 7 is a plan view showing a layout of an insulating layer, a hydrogen barrier film, and a top electrode of the semiconductor device according to the first embodiment.

FIG. 7 is a plan view showing a layout of the insulating layer 25, the hydrogen barrier film 43, and the top electrode 32.

The cross-sectional view along a one-dot chain line in FIG. 7 corresponds to the cross-sectional view of the insulating layer 25, the hydrogen barrier film 43, and the top electrode 32 in FIG. 2A. In addition, the cross-sectional view along the two-dot chain line in FIG. 5 corresponds to the cross-sectional view of the insulating layer 25, the hydrogen barrier film 43, and the top electrode 32 in FIG. 2B.

In other words, FIG. 7 corresponds to the plan view of the insulating layer 25, the hydrogen barrier film 43, and the top electrode 32 as shown in FIG. 2A, which are sectioned in the X-Y plane and viewed from an arrow direction E-E.

In FIG. 7, a dimension L21 in the Y-axis direction of a portion of the hydrogen barrier film 43 in which the top electrode 32 is not provided is, for example, in a range from approximately 32 to 36 nm. In addition, a diameter L22 of the top electrode 32 is, for example, approximately 31.5 nm. In addition, a dimension L23 in the Y-axis direction between a broken line g21 passing through the centers of the four top electrodes 32 in the i-th row and a broken line g22 passing through the centers of the four top electrodes 32 in the (i+1)-th row is, for example, approximately 54 nm. In addition, a distance L24 between the centers of the two adjacent top electrode 32 in the i-th row is approximately 63 nm. In addition, an angle θ21 formed between the broken line g22 and a broken line g23 linking the center of the j-th (i=1, 2, 3, and 4) top electrode 32 from the left in the i-th row to the center of the j-th top electrode 32 from the left in the (i+1)-th row is approximately 59.7 degrees.

In addition, as shown in FIG. 7, the four top electrodes 32 in the i-th row are surrounded by the single hydrogen barrier film 43.

Next, an example of a method of manufacturing the semiconductor device according to the embodiment will be described with reference to FIGS. 8A and 8B to FIGS. 19A and 19B. FIGS. 8A and 8B to FIGS. 17A and 17B are cross-sectional views showing the manufacturing process of the method of manufacturing the semiconductor device according to the embodiment. FIG. 8A to FIG. 19A correspond to the cross-sectional views along the arrow direction A-A of FIG. 1. In addition, FIG. 8B to FIG. 19B correspond to the cross-sectional views along the arrow direction B-B of FIG. 1.

Figure 8A:
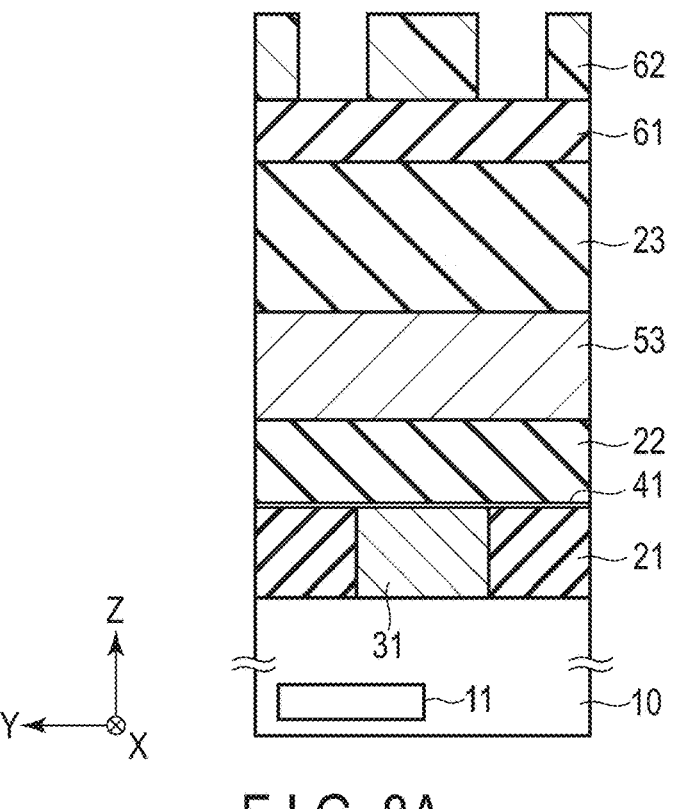
FIG. 8A is a cross-sectional view showing a manufacturing process of the semiconductor device according to the first embodiment.
Figure 8B:
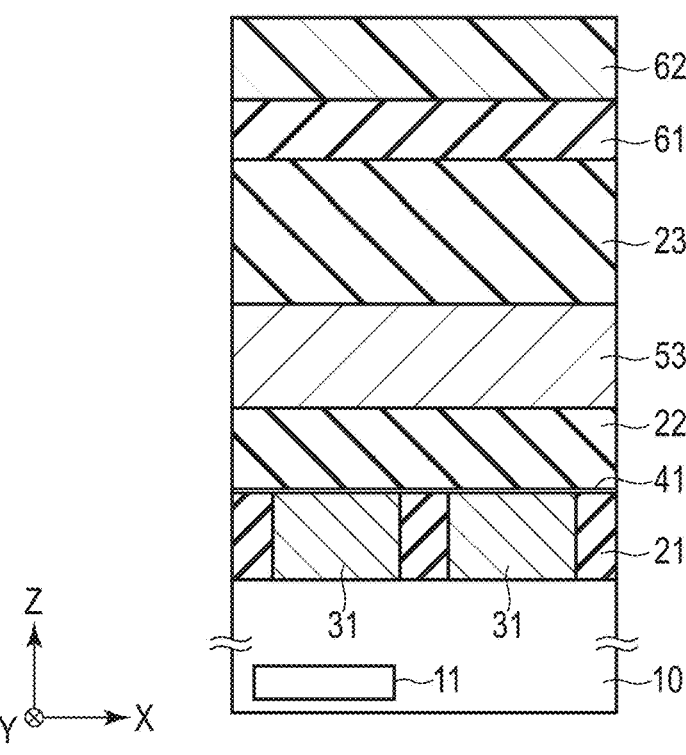
FIG. 8B is a cross-sectional view showing a manufacturing process of the semiconductor device according to the first embodiment.

First, as shown in FIG. 8A and FIG. 8B, a substrate 10 with a circuit 11 is formed and an insulating layer 21 is formed on the substrate 10. Next, the bottom electrode 31 is formed in the insulating layer 21 using a damascene process. Next, the hydrogen barrier film 41 is formed on the insulating layer 21 and the bottom electrode 31, and the insulating layer 22, the gate electrode layer 53, and the insulating layer 23 are formed sequentially on the hydrogen barrier film 41. The insulating layer 22 and the insulating layer 23 are, for example, silicon oxide films. The silicon oxide films are formed using, for example, a plasma Chemical Vapor Deposition (CVD) process. For example, silane (SiH$_4$) is used as the raw material for the silicon. In this stage, the insulating layer 22, the gate electrode layer 53, and the insulating layer 23 do not have the shapes shown in FIG. 2A and FIG. 2B. Next, an insulating layer 61 is formed on the insulating layer 23, and a resist pattern 62 is formed on the insulating layer 61.

Next, as shown in FIG. 9A and FIG. 9B, the insulating layer 61 is etched using the resist pattern 62 as a mask, and the pattern of the resist pattern 62 is transferred to the insulating layer 61. Next, the insulating layer 23, the gate electrode layer 53, the insulating layer 22, and the hydrogen barrier film 41 are etched using the resist pattern 62 and an insulating layer to which the resist pattern 62 is transferred (hereinafter referred to as a hard mask) 61 to form a trench 63, and a stacked body 64 surrounded by the trench 63 is formed. The stacked body 64 includes the insulating layer 23, the gate electrode layer 53, the insulating layer 22, and the hydrogen barrier film 41 which are etched. A part of the upper surface of the insulating layer 21 and a part of the upper surface of the bottom electrode 31 are exposed at the bottom of the trench 63. The resist pattern 62 may disappear during the etching, but the hard mask 61 does not disappear and the stacked body 64 is thereby formed.

After that, the resist pattern 62 and the hard mask 61 are removed. The resist pattern 62 is removed by, for example, ashing. The hard mask 61 is removed by, for example, wet etching.

Next, as shown in FIG. 10A and FIG. 10B, the hydrogen barrier film 42 is formed on the sidewall of the trench 63. The hydrogen barrier film 42 is formed, for example, using the following process. First, an insulating layer which is to be the hydrogen barrier film 42 is formed over the entire surface so as not to fill the trench 63. After that, the insulating layer that is formed except for the sidewall of the trench 63 is removed using etch back.

Figure 11A:
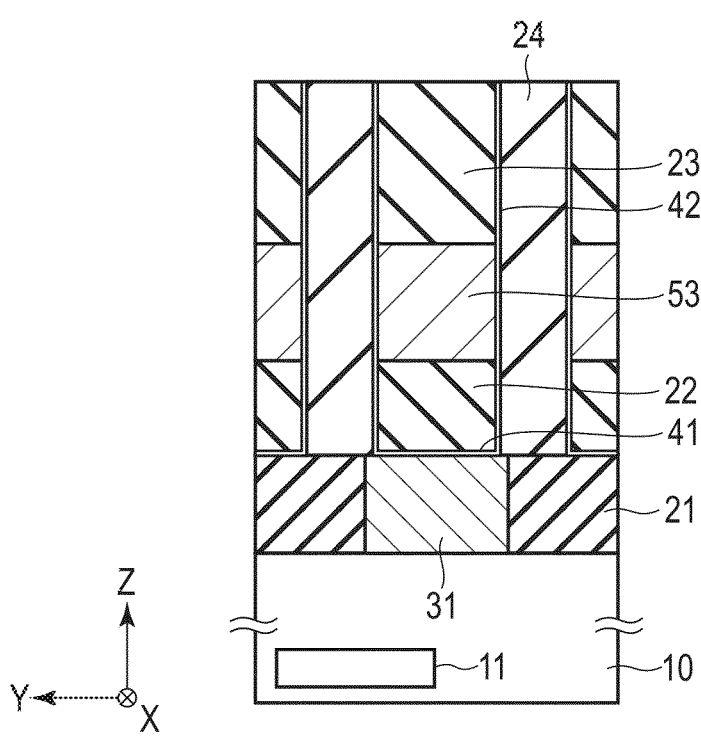
FIG. 11A is a cross-sectional view showing a manufacturing process of the semiconductor device according to the first embodiment.
Figure 11B:
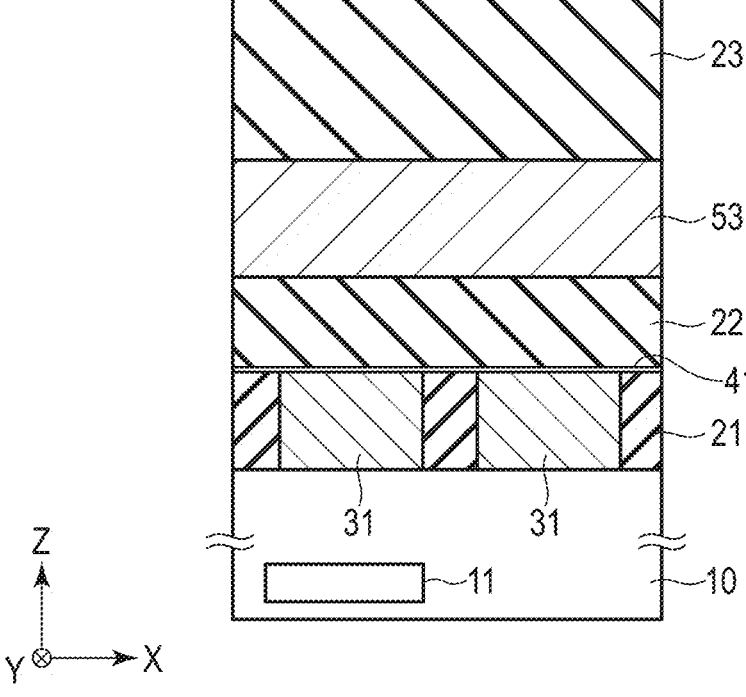
FIG. 11B is a cross-sectional view showing a manufacturing process of the semiconductor device according to the first embodiment.

Next, as shown in FIG. 11A and FIG. 11B, the insulating layer 24 is formed to fill the trench 63 shown in FIG. 10A.

For example, the insulating layer 24 is formed using the following process. An insulating film which is to be the insulating layer 24 is formed over the entire surface to fill the trench 63. This insulating film is, for example, a silicon oxide film. This silicon oxide film is formed by, for example, a plasma CVD process using a source gas containing densified tetra ethyl ortho silicate (DTEOS) or silane. After that, the insulating layer outside the trench 63 is removed using a chemical mechanical polishing (CMP) process.

Figure 12A:
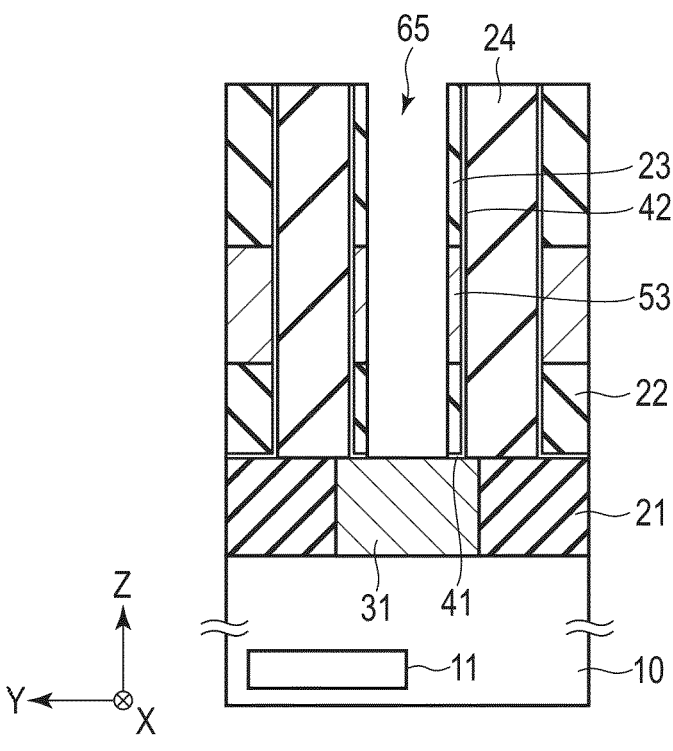
FIG. 12A is a cross-sectional view showing a manufacturing process of the semiconductor device according to the first embodiment.
Figure 12B:
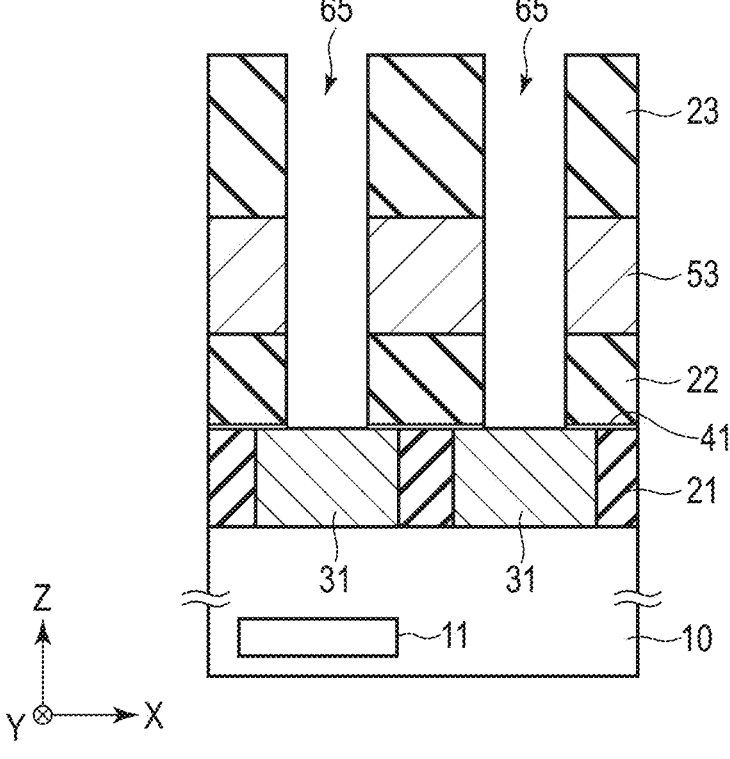
FIG. 12B is a cross-sectional view showing a manufacturing process of the semiconductor device according to the first embodiment.

Next, as shown in FIG. 12A and FIG. 12B, a through hole 65 is formed in the hydrogen barrier film 41, the insulating layer 22, the gate electrode layer 53, and the insulating layer 23 on the bottom electrode 31. A part of the upper surface of the bottom electrode 31 is exposed at the bottom of the through hole 65. The through hole 65 is formed using, for example, well-known lithography and etching processes.

Next, as shown in FIG. 13A and FIG. 13B, the oxide semiconductor layer 51 and the gate insulating layer 52 are formed in the through hole 65 shown in FIG. 12A and FIG. 12B. As a result, the vertical transistor including the oxide semiconductor layer 51, the gate insulating layer 52, and the gate electrode layer 53 is obtained. After forming the oxide semiconductor layer 51, oxygen may be added to the oxide semiconductor layer 51 using a technique such as ion implantation or ion doping.

The oxide semiconductor layer 51 and the gate insulating layer 52 are formed using, for example, the following process. First, the gate insulating layer 52 is formed over the entire surface so as not to fill the through hole 65. Next, the gate insulating layer 52 other than the side surface of the through hole 65 is removed using etch-back. Next, the oxide semiconductor layer 51 is formed over the entire surface to fill the through hole 65 whose side surface is covered with the gate insulating layer 52. Next, the oxide semiconductor layer 51 outside the through hole 65 is removed using the CMP process.

Figure 14A:
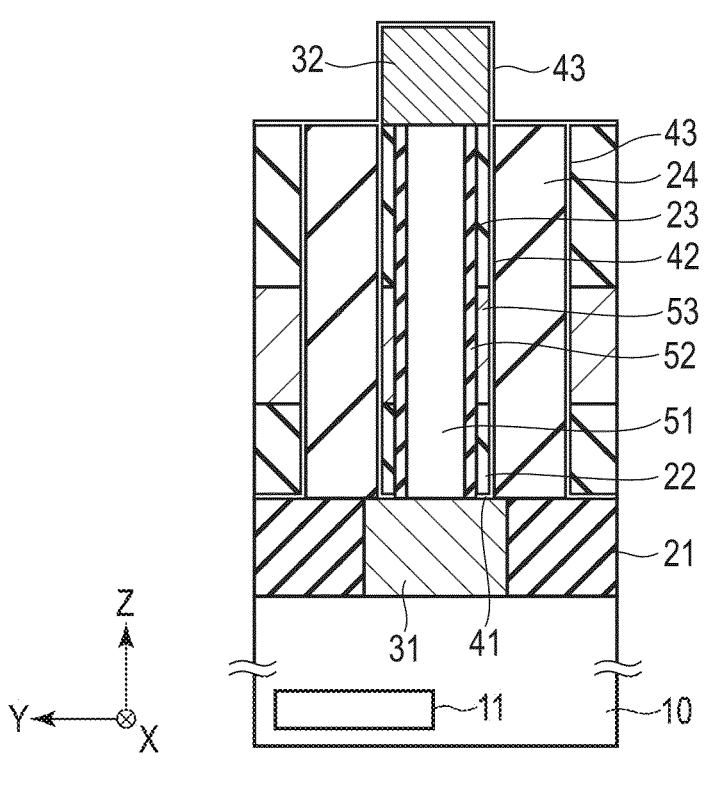
FIG. 14A is a cross-sectional view showing a manufacturing process of the semiconductor device according to the first embodiment.
Figure 14B:
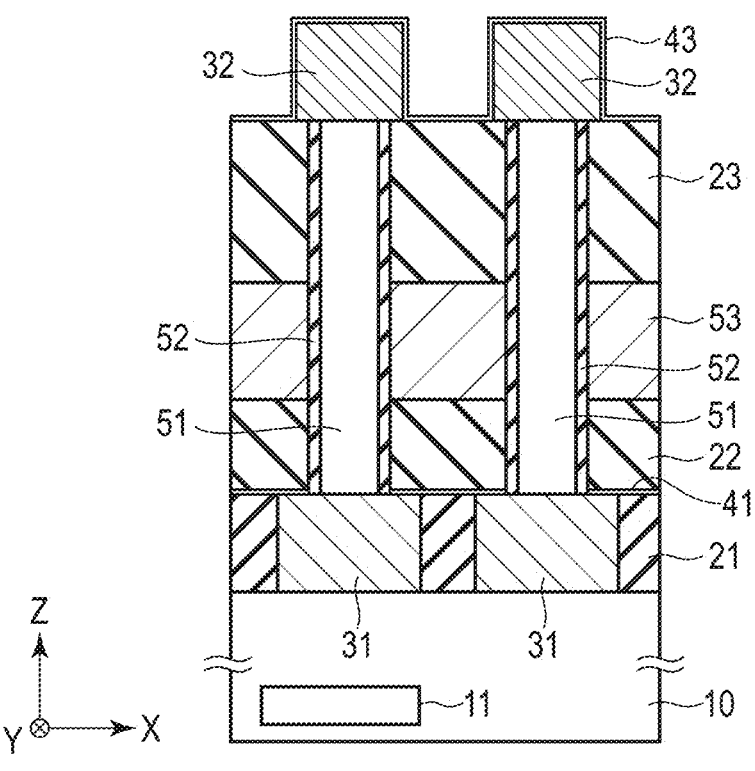
FIG. 14B is a cross-sectional view showing a manufacturing process of the semiconductor device according to the first embodiment.

Next, as shown in FIG. 14A and FIG. 14B, the top electrode 32 is formed, and then the conformal hydrogen barrier film 43 is formed over the entire surface to cover the side and upper surfaces of the top electrode 32.

Figure 15A:
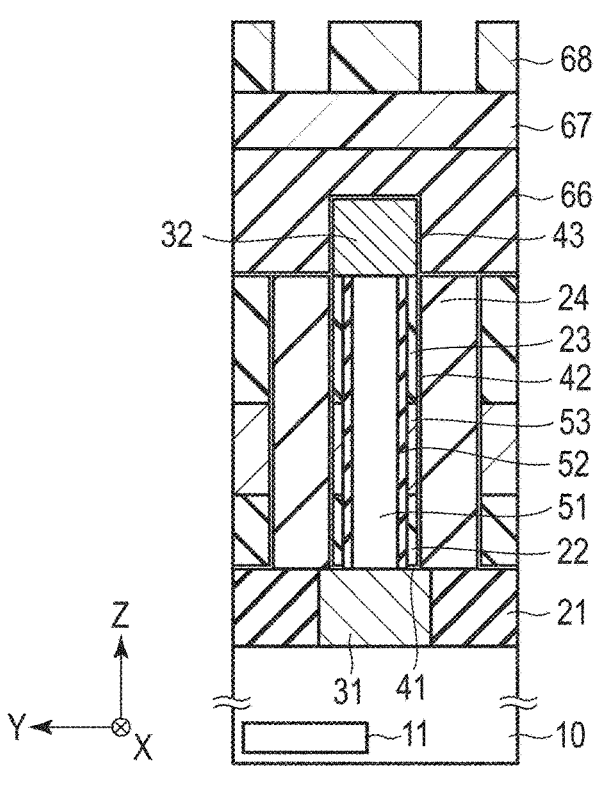
FIG. 15A is a cross-sectional view showing a manufacturing process of the semiconductor device according to the first embodiment.
Figure 15B:
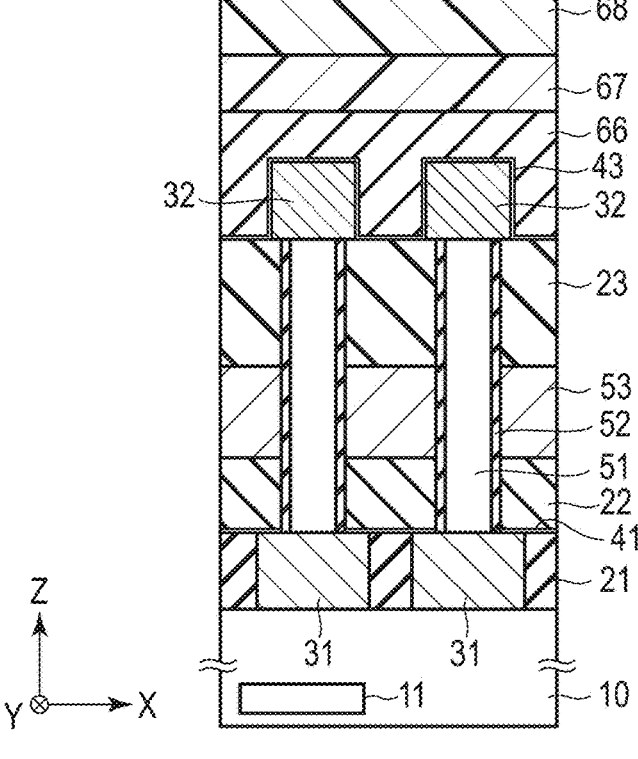
FIG. 15B is a cross-sectional view showing a manufacturing process of the semiconductor device according to the first embodiment.

Next, as shown in FIG. 15A and FIG. 15B, an insulating layer 66 with a flat surface is formed to cover the top electrode 32 and the hydrogen barrier film 43. The insulating layer 66 can be formed using, for example, CVD and CMP processes. Next, an insulating layer 67 is formed on the insulating layer 66, and a resist pattern 68 is formed on the insulating layer 67.

Next, as shown in FIG. 16A and FIG. 16B, the insulating layer 67 is etched using the resist pattern 68 as a mask, and the pattern of the resist pattern 68 is transferred to the insulating layer 67. Next, the insulating layer 66 and the hydrogen barrier film 43 are etched using the resist pattern 68 and the insulating layer to which the pattern of the resist pattern 68 is transferred (hereinafter referred to as a hard mask) 67 as a mask to expose the upper surface of the insulating layer 24. The etching is executed using, for example, a reactive ion etching (RIE) process, or the RIE process and the wet process.

After that, the resist pattern 68, the hard mask 67, and the insulating layer 66 are removed. The resist pattern 68 is removed by, for example, ashing. In addition, the hard mask 67 and the insulating layer 66 are removed by, for example, wet etching.

Next, as shown in FIG. 17A and FIG. 17B, the insulating layer 25 with a flat surface is formed on the insulating layer 24 and the hydrogen barrier film 43.

Figure 18A:
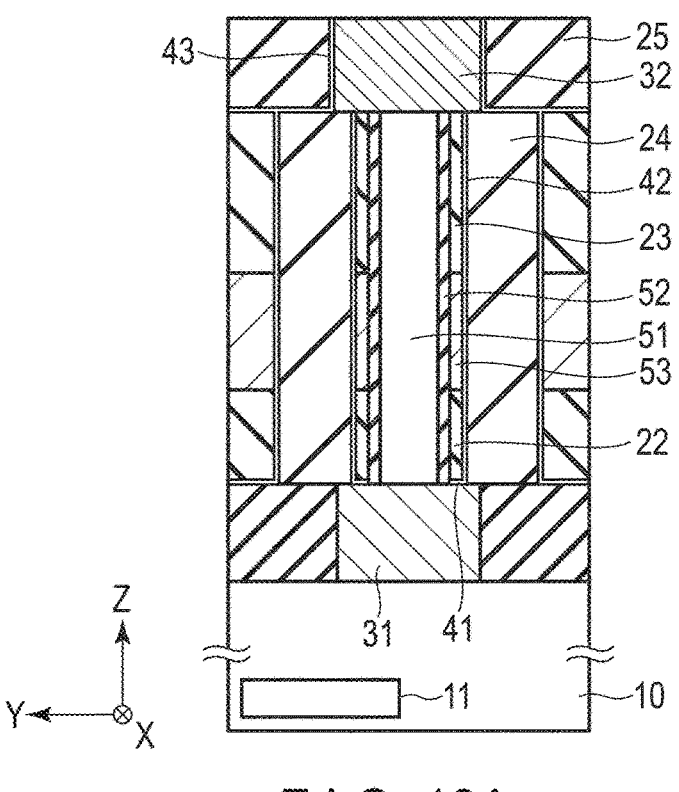
FIG. 18A is a cross-sectional view showing a manufacturing process of the semiconductor device according to the first embodiment.
Figure 18B:
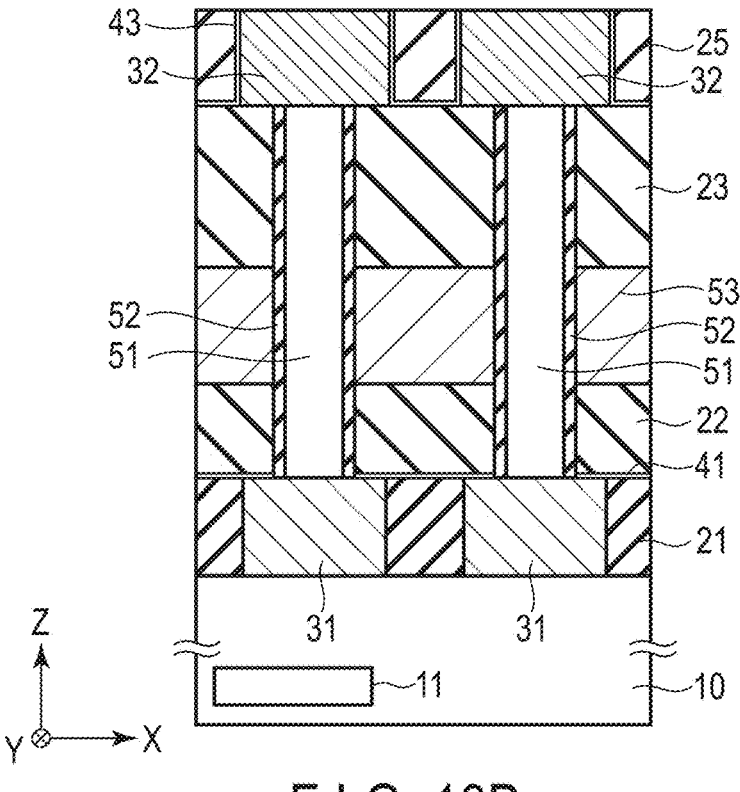
FIG. 18B is a cross-sectional view showing a manufacturing process of the semiconductor device according to the first embodiment.

Next, as shown in FIG. 18A and FIG. 18B the insulating layer 25 and the hydrogen barrier film 43 are polished using the CMP process until the upper surface of the top electrode 32 is exposed.

Figure 19A:
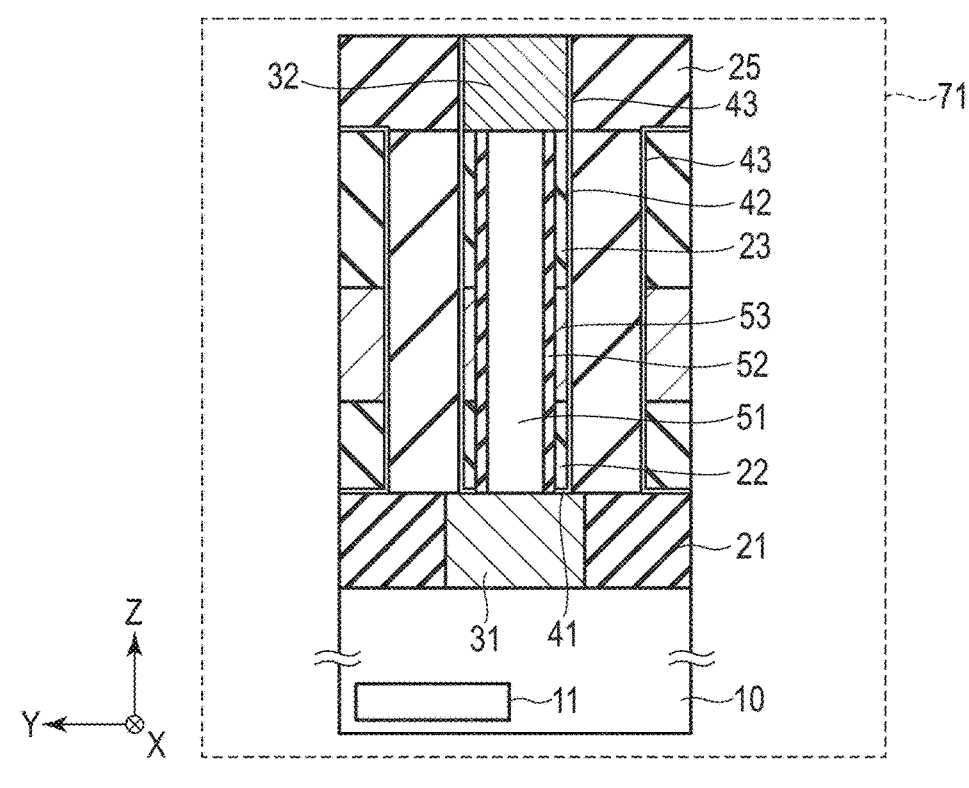
FIG. 19A is a cross-sectional view showing a manufacturing process of the semiconductor device according to the first embodiment.
Figure 19B:
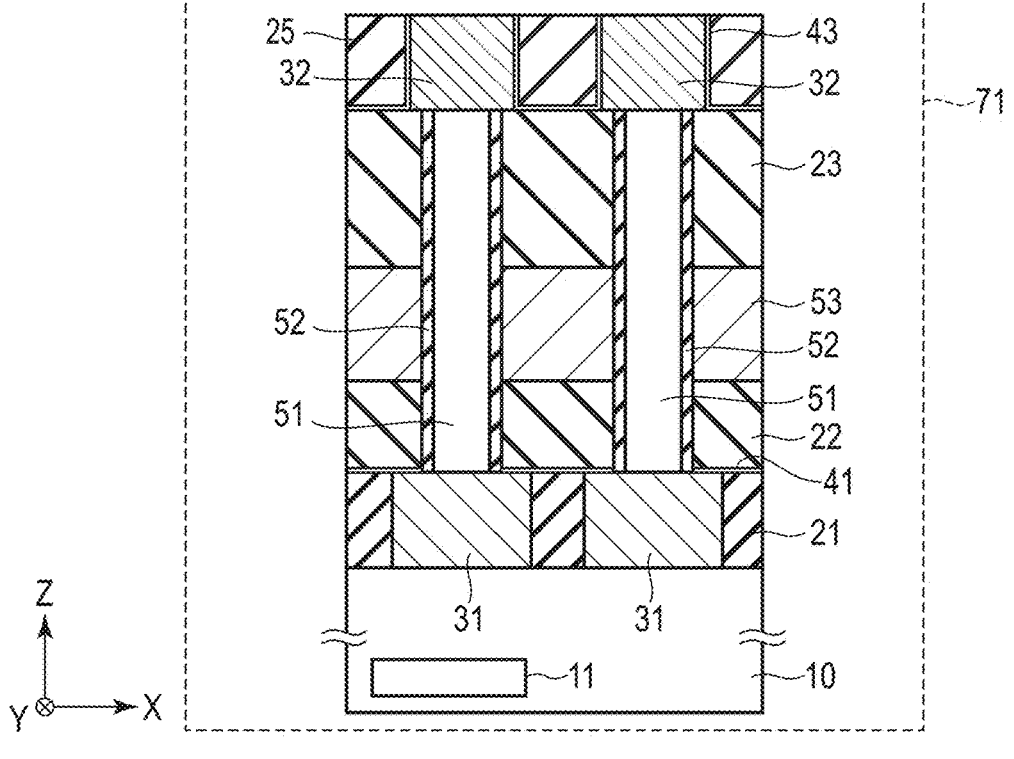
FIG. 19B is a cross-sectional view showing a manufacturing process of the semiconductor device according to the first embodiment.

Next, as shown in FIG. 19A and FIG. 19B, dangling bonds of atoms such as silicon that constitute the circuit 11 in the substrate 10 are terminated by hydrogen using annealing (hydrogen annealing) in a hydrogen-containing atmosphere (hydrogen atmosphere) 71. The hydrogen atmosphere 71 is, for example, a foaming gas (a mixed gas containing hydrogen and nitrogen).

Diffusion of hydrogen into the oxide semiconductor layer 51 in the hydrogen annealing process is suppressed by the hydrogen barrier films 41 to 43. Therefore, the characteristic degradation of the vertical transistor caused by the annealing in the hydrogen atmosphere 71 is suppressed.

The hydrogen barrier films 41 to 43 can be detected by physical analysis using, for example, energy dispersive X-ray spectroscopy (TEM-EDX).

In the above descriptions, the type of the semiconductor device 1 has not been particularly mentioned, but the semiconductor device 1 is, for example, a dynamic random access memory (DRAM). When the semiconductor device 1 is a DRAM, the vertical transistor Tr constitutes the memory cell of the memory cell array unit, and the circuit 11 constitutes the CMOS circuit of the peripheral circuits.

FIG. 20 shows an equivalent circuit, illustrating a part of the memory cell array unit MCA of the DRAM. The memory cell array unit MCA includes a plurality of memory cells MC, a plurality of word lines WL, and a plurality of bit lines BL.

The plurality of memory cells MC are arrayed in a matrix. Each of the memory cells MC includes the vertical transistor Tr and a capacitor CP. Gates of the plurality of vertical transistors Tr are connected to each word line WL. Drains (or sources) of the plurality of vertical transistors Tr are connected to each bit line BL. One of electrodes of the capacitor CP is connected to, for example, the source (or drain) of the vertical transistor Tr. The other electrode of the capacitor CP is connected to a power line (not shown) that supplies a specific potential.

The memory cell array unit MCA includes a plurality of unit memory array portions. The plurality of memory cells MC connected to the same word line WL constitute one unit memory array portion. The hydrogen barrier film in this embodiment is provided for each unit memory array portion. In other words, a separate hydrogen barrier film is not provided for each of the plurality of vertical transistors that constitute the unit memory array portions.

FIG. 21 is a top view showing an example of a capacitor CP in the memory cell MC. FIG. 22 is a cross-sectional view taken along line F-F of FIG. 21.

The capacitor CP is a trench-type capacitor provided in a stacked insulating film of a silicon oxide film 86 and a silicon nitride film 87. The capacitor CP is located below a vertical transistor (not shown).

The capacitor CP includes an amorphous silicon film 81, a titanium nitride film 82, an ITO electrode 83, a high-k film 84, and a titanium nitride film 85.

The titanium nitride film 82 covers an upper surface, a side surface, and a bottom surface of the amorphous silicon film 81. The ITO electrode 83 is provided on the amorphous silicon film 81 such that the titanium nitride film 82 is interposed between the ITO electrode 83 and the amorphous silicon film 81. The ITO electrode 83 is connected to a vertical transistor (not shown). The amorphous silicon film 81, the titanium nitride film 82, and the ITO electrode 83 constitute one of electrodes of the capacitor CP.

The high-k film 84 covers a side surface and a bottom surface of the titanium nitride film 82. The high-k film 84 is a dielectric film with a higher dielectric constant than $SiO_2$. The high-k film 84 constitutes the dielectric film of the capacitor CP.

The titanium nitride film 85 covers a bottom surface of the high-k film 84, and a side surface of the high-k film 84 except an upper side surface. The titanium nitride film 85 constitutes the other electrode of the capacitor CP. The bottom surface of the high-k film 84 is connected to an electrode or line 88. The ITO electrode 88 is connected to a vertical transistor (not shown).

A capacitor provided above the vertical transistor may be used instead of the capacitor CP.

A process of manufacturing the DRAM includes, for example, a process of forming a line 90 having a closed-loop pattern as shown in a plan view of FIG. 23. The line 90 consists of a word line and a gate electrode layer connected to the word line. Areas surrounded by broken lines 91 indicate areas where the gate electrode layer exists.

The line 90 is loop-cut as shown in a plan view of FIG. 24. As a result, the line 90 is divided into two pieces. Areas 92 surrounded by broken lines in FIG. 23 indicate end parts of the lines 90, which are exposed by loop cutting. If hydrogen annealing is performed in this state, the characteristics of the oxide semiconductor layer of the vertical transistor may be degraded by hydrogen that enters from the edge of the line 90. Therefore, in the embodiment, hydrogen barrier films 44 are formed on end parts 92 of the lines 90 as shown in FIG. 25 before performing the hydrogen annealing.

The vertical transistor using the oxide semiconductor layer of the embodiment can also be applied to semiconductor devices other than DRAM.

Second Embodiment

FIG. 26 is a cross-sectional view showing a semiconductor device 2 according to a second embodiment. This cross-sectional view corresponds to the cross-sectional view taken along line A-A in FIG. 1. The cross-sectional view of the semiconductor device 2 taken along line B-B in FIG. 1 is the same as FIG. 2B. In addition, the top view of the semiconductor device 2 is the same as FIG. 1.

The semiconductor device 2 according to this embodiment is different from the semiconductor device 1 according to the first embodiment in that a hydrogen barrier film 42 is composed of two hydrogen barrier films 42a and 42b.

The hydrogen barrier film 42a surrounds side surfaces of an insulating layer 22, a gate electrode layer 53, and an insulating layer 23. The hydrogen barrier film 42b surrounds a side surface of the hydrogen barrier film 42a. The hydrogen barrier film 42b is positioned on an outer side than the hydrogen barrier film 42a with respect to the side surfaces of the insulating layer 22, the gate electrode layer 53, and the insulating layer 23.

The hydrogen barrier film 42a is, for example, an insulating film (insulating hydrogen barrier film) with a lower hydrogen permeability than a silicon dioxide film, more specifically, a silicon nitride film, an alumina film, a titanium oxide film, or a chromium oxide film.

The hydrogen barrier film 42b is a conductive film (conductive hydrogen barrier film) with a lower hydrogen permeability than a silicon dioxide film, more specifically, a ruthenium film, a titanium nitride film, or a titanium carbide film. Either of the hydrogen barrier film 42*a* or the hydrogen barrier film 42*b* may have the hydrogen barrier property.

FIG. 26 shows an example in which a Y-axis dimension (first dimension) of the hydrogen barrier film 42*a* is larger than a Y-axis dimension (second dimension) of the hydrogen barrier film 42*b*, but the first dimension and the second dimension may be the same, or the first dimension may be smaller than the second dimension.

In the embodiment, similarly to the first embodiment, the diffusion of hydrogen into the oxide semiconductor layer 51 is suppressed by the hydrogen barrier films 41, 42 (42*a* and 42*b*), and 43, and the characteristic degradation of the oxide semiconductor layer 51 caused by hydrogen is therefore suppressed. For this reason, the semiconductor device 2 including a vertical transistor Tr capable of attempting suppression of the characteristic degradation can be obtained.

The hydrogen barrier film 41 can be formed with a stacked structure of an insulating hydrogen barrier film and a conductive hydrogen barrier film, and the hydrogen barrier film 43 can be formed with a stacked structure of an insulating hydrogen barrier film and a conductive hydrogen barrier film. In addition, the semiconductor device 2 is, for example, a DRAM, similarly to the first embodiment.

Next, an example of a method of manufacturing the semiconductor device 2 according to the embodiment will be described. First, the structure shown in FIG. 9A is formed according to the method described in the first embodiment, and then the resist pattern 62 and the hard mask 61 are removed.

Figure 27:
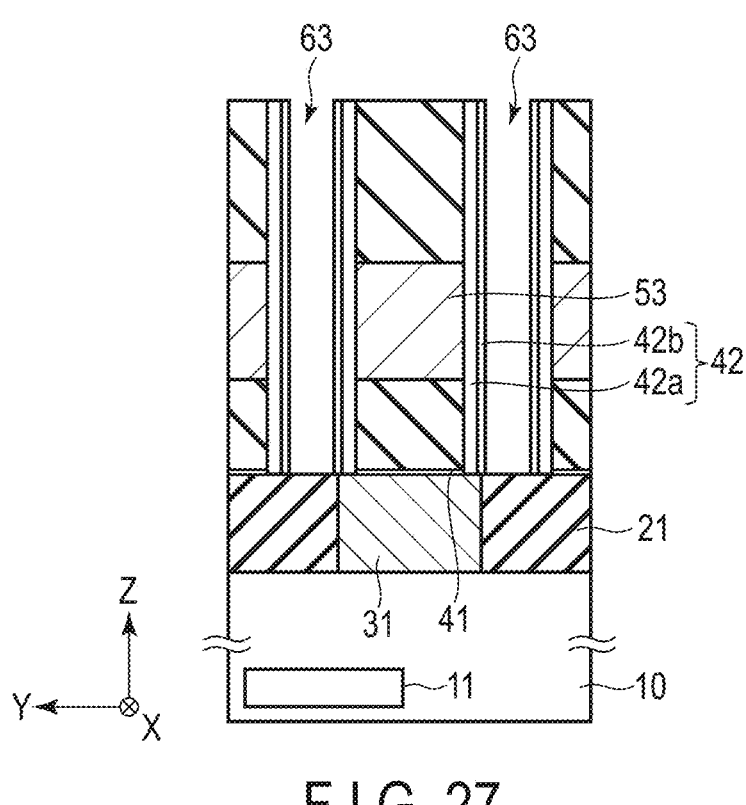
FIG. 27 is a cross-sectional view showing a manufacturing process of the semiconductor device according to the second embodiment.

Next, as shown in FIG. 27, the hydrogen barrier films 42*a* and 42*b* are formed on sidewalls of trenches 63.

The hydrogen barrier film 42*a* and the hydrogen barrier film 42*b* are formed using, for example, the following process. First, a first film that is to be the hydrogen barrier film 42*a* and a second film that is to be the hydrogen barrier film 42*b* are sequentially formed over the entire surface so as not to fill the trenches 63 and cover the sidewalls of the trenches 63 and the bottom of the trenches 63. Next, the first and second films are removed by etch-back, except for the sidewalls of the trenches 63, and the hydrogen barrier films 42*a* and 42*b* can be thereby obtained.

Figure 28:
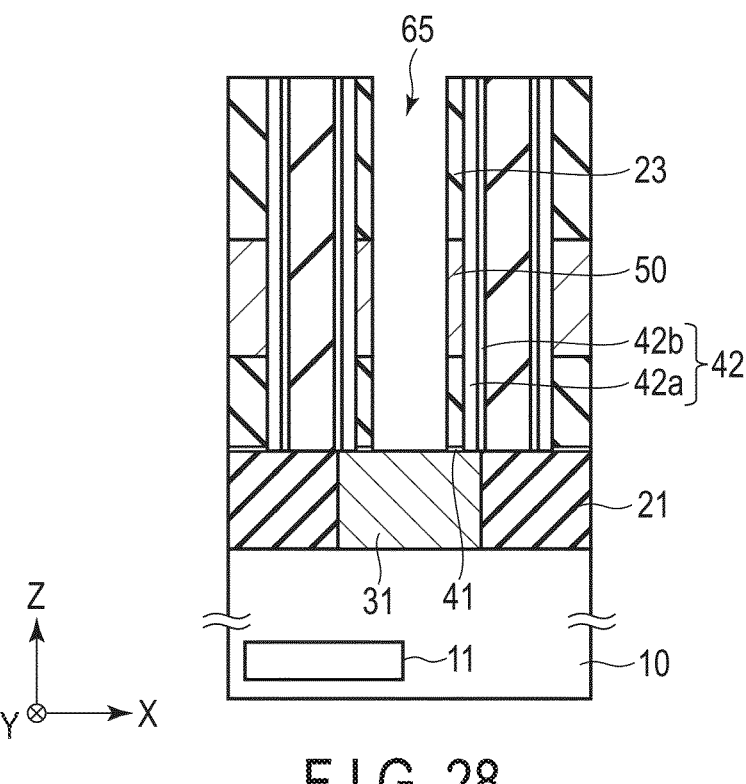
FIG. 28 is a cross-sectional view showing a manufacturing process of the semiconductor device according to the second embodiment.

Next, as shown in FIG. 28, an insulating layer 24 to be filled in the trenches 63 shown in FIG. 27 is formed, and then a through hole 65 is formed in an insulating layer 23, a gate electrode layer 53, an insulating layer 22, and a hydrogen barrier film 41.

Next, as shown in FIG. 29, an oxide semiconductor layer 51 and a gate insulating layer 52 are formed in the through hole 65 shown in FIG. 23. As a result, the vertical transistor including the oxide semiconductor layer 51, the gate insulating layer 52, and the gate electrode layer 53 is obtained.

Next, as shown in FIG. 30, a top electrode 32 is formed, and then a conformal hydrogen barrier film 43 is formed over the entire surface to cover a side surface and an upper surface of the top electrode 32.

After this, the semiconductor device 2 of the embodiment is obtained by using the manufacturing method of the first embodiment described with reference to FIGS. 13A and 13B to FIGS. 19A and 19B.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a first electrode;
a first insulating layer provided above the first electrode;
a gate electrode layer provided on the first insulating layer;
a second insulating layer provided on the gate electrode layer;
an oxide semiconductor layer provided along the second insulating layer, the gate electrode layer and the first insulating layer;
a gate insulating layer provided along the second insulating layer, the gate electrode layer and the first insulating layer, and surrounding a side surface of the oxide semiconductor layer; and
a first hydrogen barrier film surrounding the oxide semiconductor layer and the gate insulating layer, wherein the first insulating layer, the gate electrode layer and the second insulating layer are interposed between the first hydrogen barrier film and a layer including the oxide semiconductor layer and the gate insulating layer, wherein a portion of the first hydrogen barrier film is provided between the first electrode and the first insulating layer.

2. The semiconductor device of claim 1, further comprising:
an another oxide semiconductor layer other than the oxide semiconductor layer, provided along the second insulating layer, the gate electrode layer and the first insulating layer; and
an another gate insulating layer other than the gate insulating layer, provided along the second insulating layer, the gate electrode layer and the first insulating layer, and surrounding a side surface of the another oxide semiconductor layer.

3. The semiconductor device of claim 2, further comprising:
a third insulating layer provided on side surfaces of the first insulating layer, the gate electrode layer and the second insulating layer, wherein the first hydrogen barrier film is interposed between the third insulating layer and a layer including the first insulating layer, the gate electrode layer and the second insulating layer.

4. The semiconductor device of claim 3, wherein a lower surface and an upper surface of the third insulating layer are not covered with a hydrogen barrier film.

5. The semiconductor device of claim 4, further comprising:
an electrode provided on an upper surface of the oxide semiconductor layer; and
a second hydrogen barrier film provided on a side surface of the electrode.

6. The semiconductor device of claim 5, wherein the electrode includes a conductive film having a hydrogen barrier property.

7. The semiconductor device of claim 6, further comprising:
a substrate; and
a circuit provided in the substrate, wherein the oxide semiconductor layer is provided between the substrate and the electrode.

8. The semiconductor device of claim 7, wherein the oxide semiconductor layer contains indium, gallium, zinc and oxygen.

9. The semiconductor device of claim 7, wherein the first hydrogen barrier film is an insulating film with a lower hydrogen permeability than a silicon dioxide film.

10. The semiconductor device of claim 7, wherein the first hydrogen barrier film includes:

an insulating film with a lower hydrogen permeability than a silicon dioxide film; and a conductive film with a lower hydrogen permeability than a silicon dioxide film.

11. The semiconductor device of claim 9, wherein the insulating film with the lower hydrogen permeability than the silicon dioxide film is a silicon nitride film, an alumina film, a titanium oxide film or a chromium oxide film.

12. The semiconductor device of claim 10, wherein the insulating film with the lower hydrogen permeability than the silicon dioxide film is a silicon nitride film, an alumina film, a titanium oxide film or a chromium oxide film.

13. The semiconductor device of claim 10, wherein the conductive film with the lower hydrogen permeability than the silicon dioxide film is a ruthenium film, a titanium nitride film or a titanium carbide film.

14. The semiconductor device of claim 12, wherein the conductive film with the lower hydrogen permeability than the silicon dioxide film is a ruthenium film, a titanium nitride film or a titanium carbide film.

15. The semiconductor device according to claim 1, wherein the first hydrogen barrier film provided on the first electrode.

16. The semiconductor device according to claim 1, wherein a portion of the first hydrogen barrier film, the first insulating layer, the gate electrode layer, and the second insulating layer are provided above the first electrode in a vertical direction.

17. The semiconductor device of claim 1, further comprising:

a transistor including the oxide semiconductor layer, the gate insulating layer, and the gate electrode layer; and a capacitor provided below the transistor.

\* \* \* \* \*